(12) United States Patent
Fenk

(10) Patent No.: US 7,649,371 B2
(45) Date of Patent: Jan. 19, 2010

(54) THERMAL STRATIFICATION METHODS

(75) Inventor: C. Walter Fenk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 11/678,674

(22) Filed: Feb. 26, 2007

(65) Prior Publication Data

US 2007/0132479 A1 Jun. 14, 2007

Related U.S. Application Data

(62) Division of application No. 10/389,632, filed on Mar. 13, 2003, now Pat. No. 7,202,684.

(51) Int. Cl.
*G01R 31/02* (2006.01)
*H05K 7/20* (2006.01)
(52) U.S. Cl. .................... 324/760; 165/80.3
(58) Field of Classification Search ......... 324/754–765; 165/80.1–80.4; 361/688–723
See application file for complete search history.

(56) References Cited

U.S. PATENT DOCUMENTS

| | | | |
|---|---|---|---|
| 5,325,052 A | | 6/1994 | Yamashita |
| 5,450,018 A | | 9/1995 | Rieser et al. |
| 5,600,257 A | * | 2/1997 | Leas et al. .................. 324/754 |
| 5,701,666 A | * | 12/1997 | DeHaven et al. ............. 29/831 |
| 6,094,059 A | * | 7/2000 | Frankeny et al. ............ 324/757 |
| 6,271,024 B1 | | 8/2001 | Sve et al. |
| 6,313,653 B1 | | 11/2001 | Takahashi et al. |
| 7,202,684 B2 | | 4/2007 | Fenk |

FOREIGN PATENT DOCUMENTS

| | | |
|---|---|---|
| EP | 1111398 A2 | 6/2001 |
| JP | 08-136442 | 5/2008 |
| WO | WO-03/017326 A2 | 2/2003 |
| WO | WO-2004083747 A2 | 9/2004 |
| WO | WO-2004083747 A3 | 9/2004 |

OTHER PUBLICATIONS

"European Patent Application No. 04715159.2, Communication mailed Sep. 20, 2007", 4 pgs.

(Continued)

*Primary Examiner*—Ernest F Karlsen
(74) *Attorney, Agent, or Firm*—Schwegman, Lundberg & Woessner, P.A.

(57) ABSTRACT

A method and apparatus for a thermal stratification test providing cyclical and steady-state stratified environments. In order to test an electronic device, for example one having one or more levels of ball-grid-array interconnections, e.g., connecting a chip to a flip-chip substrate and connecting the flip-chip substrate to a printed circuit board of a device, an apparatus and method are provided to heat one side of the device while cooling the second side. In some embodiments, the process is then reversed to cool the first side and heat the second. Some embodiments repeat the cycle of heat-cool-heat-cool several times, and then perform functional tests of the electronic circuitry. In some embodiments, the functional tests are performed in one or more thermal-stratification configurations after cycling at more extreme thermal stratification setups. In some embodiments, a test that emphasizes solder creep is employed.

14 Claims, 14 Drawing Sheets

OTHER PUBLICATIONS

"International Preliminary Report on Patentability and Written Opinion of the International Searching Authority for corresponding PCT Application No. PCT/US2004/006049", 6 pgs.

"Office Action for corresponding European Patent Application No. 04715159.2", (Jul. 10, 2006),4 pgs.

"Power Cycling Simulation by Radiant Heat", *IBM Technical Disclosure Bulletin*, 31(11), (Apr. 1, 1989),170-171.

"Chinese Patent Application Serial No. 200480006878.0, Office Action mailed Apr. 4, 2008", 12 pgs.

"European Patent Application Serial No. 04715159.2, Response filed Mar. 27, 2008 to Office Action (Communication) dated Sep. 20, 2007", 20 pgs.

"European Patent Application No. 04715159.2, Response filed Jan. 22, 2007 to Communication mailed Jul. 10, 2006", 11 pgs.

"PCT Application No. PCT/US2004/006049, International Search Report mailed Sep. 3, 2004", 4 pgs.

"Prosecution File History for U.S. Appl. No. 10/389,632", (now US 7,202,684), 137 pgs.

* cited by examiner

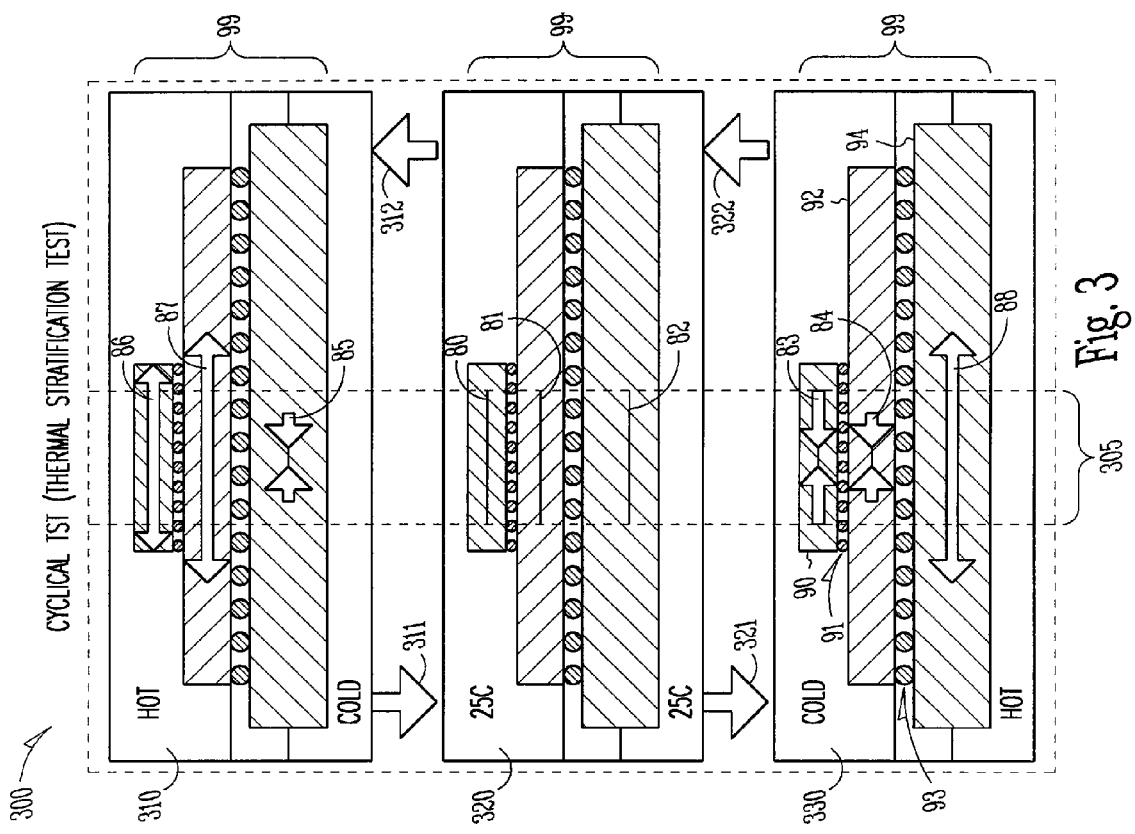
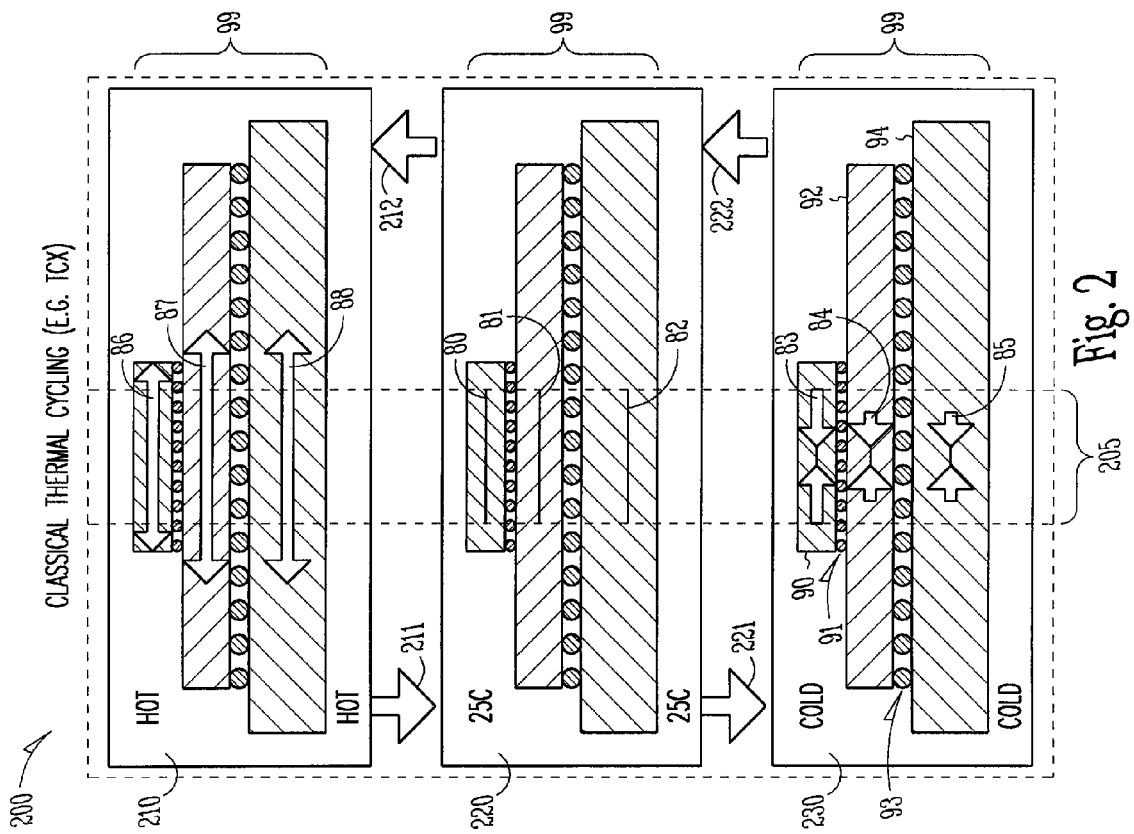

THERMAL STRATIFICATION METHODS

RELATED APPLICATIONS

This application is a Divisional of U.S. application Ser. No. 10/389,632 filed Mar. 13, 2003 now U.S. Pat. No. 7,202,684, which is incorporated herein by reference.

FIELD OF THE INVENTION

This invention relates to the field of electronic circuit testing devices and methods, and more specifically to a method and apparatus for testing circuits in cyclical and steady-state thermally stratified environments.

BACKGROUND OF THE INVENTION

Packaged electronic chips that are mounted on printed circuit boards (PCBs) typically need to be tested. Frequently, prior testing was done at a wafer level after the chips have been largely fabricated, but before the chips are diced apart and packaged. Such a test is often called a wafer test and sort operation, since good chips can be sorted from bad chips that fail the test, saving time and money since the bad chips are discarded (or re-worked) before the effort of packaging the chips. Additional functional testing is often done after the chip is assembled to its first-level packaging, for example, when an integrated circuit having solder-ball connections in a ball-grid array (BGA) is attached to a multiple-layer-ceramic (MLC) flip-chip substrate (FC substrate). Such an assembly often has larger solder-ball connections for connecting to a PCB, and is called a FCBGA device. One or more such devices are mounted to a PCB to form a printed-board assembly (PBA).

There are failure modes of PBAs that are caused by or induced by differences in the respective coefficient of thermal expansion (CTE) of the various parts, e.g., of the silicon chip, the FC substrate, the PCB, and the solder-ball interconnections between various parts.

Conventional board-level test procedures sometimes include temperature cycling wherein the printed circuit board and its components are placed within a chamber that can be heated or refrigerated. To test a design's capability to withstand years of use, the temperature in the chamber is cycled from one extreme to another. Even so, some design flaws will not be discovered. Undiscovered design errors can result in a substantial capital cost to the chip and PBA manufacturer. Other testing needs include testing to verify the capabilities of new manufacturing processes (such as new solder compositions or new assembly processes) as well as manufacturing stress testing to precipitate and detect latent defects that were due to defective materials and/or manufacturing process errors.

What is needed is a fast, simple, inexpensive, reliable method and apparatus to test electronic chips and their connections to printed board assemblies, so that the tester is compact and quickly detects many temperature-dependent faults.

BRIEF DESCRIPTION OF THE DRAWINGS

FIG. 2 is side schematic flowchart of a classical thermal cycling test procedure 200.

FIG. 3 is side schematic flowchart of a TST (Thermal Stratification Test) procedure 300.

DESCRIPTION OF PREFERRED EMBODIMENTS

Figure 1:
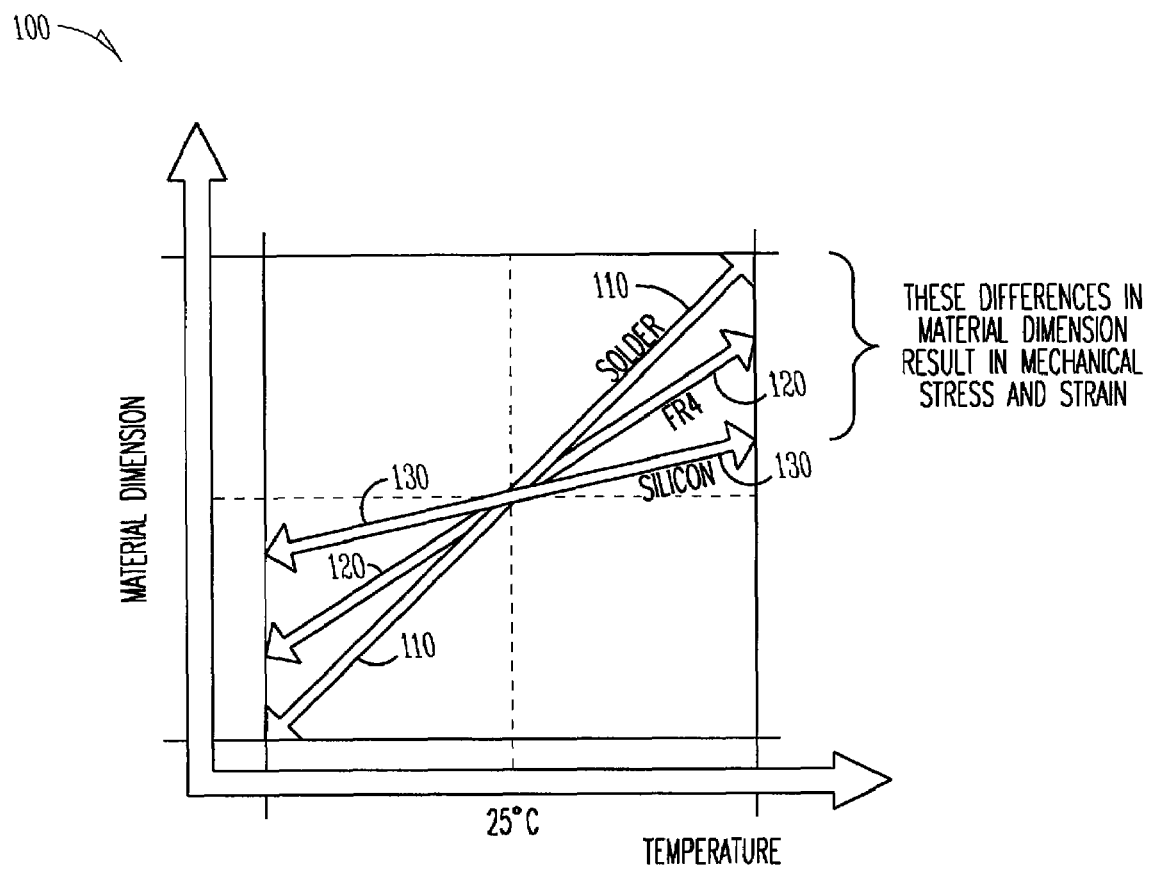
FIG. 1 is a graph 100 of thermal expansion vs. temperature for some materials.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description. The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element. The term fluid includes gases (such as air) and liquids (such as Freon®, for example).

The term substrate generally refers to the physical object that is the basic workpiece that is transformed by various process operations into the desired microelectronic configuration. Substrates may include conducting material (such as copper or aluminum), insulating material (such as sapphire, ceramic, fiber glass, or plastic), semiconducting materials (such as silicon), non-semiconducting, or combinations of semiconducting and non-semiconducting materials. In some embodiments, substrates include layered structures, such as a sheet of material chosen for electrical and/or thermal conductivity (such as copper) covered with a layer of insulating material chosen for electrical insulation, stability, and embossing characteristics.

The term vertical is defined to mean substantially perpendicular to the major surface of a substrate. The terms height or depth refer to a distance in a direction perpendicular to the major surface of a substrate.

Particularly with BGA connections, different amounts of heat-induced expansion (e.g., between the chip and the printed circuit it is attached to using solder balls) can cause the solder-ball connections to fail (to open). Defects in end-user PBAs are due to design error, material (component) variance, and/or assembly process variance. Defects related to design error are due to CTE mismatch. Defects related to material variance or process variance are not strictly due CTE mismatch. However, intermittent or latent defects related to material variance or assembly process variance may be precipitated to hard failure via leveraging CTE variance. Once precipitated via a process such as cyclical thermal stratification testing (cyclical TST is where opposite sides of the BGA connections are alternately and repeatedly cycled hot/cold and cold/hot), these hard failures may be detected via a process such as a steady-state TST (a TST wherein opposite sides of the BGA connections are made hot/cold and functional electrical tests are performed).

FIG. 1 is a conceptual graph 100 of thermal expansion vs. temperature for some materials. The coefficient of thermal expansion differs for various materials, for example solder, FR4 substrate material, and silicon (the substrate for integrated circuit chips). Thus, the lateral dimension versus temperature graph 110 for solder differs in slope from the lateral dimension versus temperature graph 120 for FR4 material, and from the lateral dimension versus temperature graph 130 for silicon. These differences in lateral dimension result in mechanical stress and strain as a printed board assembly (PBA) experiences different temperatures.

FIG. 2 is side schematic flowchart of a classical thermal cycling test procedure 200. At block 220 of procedure 200, the entire PBA (printed circuit board assembly) 99 is placed in a chamber at room temperature (about 25 degrees Celsius). A first temperature transition 221 is effected in the chamber and at block 230 the entire PBA 99, including its chip 90, chip ball-grid-array interface 91, flip-chip (FC) substrate 92, package ball-grid-array interface 93, and printed circuit board (PCB) 94, is made cold. That is, all portions of PBA 99 are surrounded by cold surfaces and/or a cold atmosphere that is, in some embodiments, stirred or blown in a turbulent flow to transfer that cold temperature to PBA 99. A second temperature transition 222 is effected in the chamber, and at block 220, again the entire PBA 99 is brought to room temperature. That is, all portions of PBA 99 are surrounded by 25 degrees Celsius surfaces and/or a 25 degrees Celsius atmosphere that is, in some embodiments, stirred or blown in a turbulent flow to transfer that 25 degrees Celsius temperature to PBA 99. In some embodiments, block 220 is merely a portion of the transition from block 230 to block 210, wherein there is no attempt to hold at room temperature for any amount of time (i.e., transition 222 and 212 are combined as a single transition from cold to hot). A third temperature transition 212 is effected in the chamber and at block 210; the entire PBA 99 is brought to an elevated temperature (e.g., 50, 80 or 100 degrees Celsius). A fourth temperature transition 211 is effected in the chamber and at block 220 the entire PBA 99 is again brought to room temperature. In some embodiments, block 220 is merely a portion of the transition from block 210 to block 230, wherein there is no attempt to hold at room temperature for any amount of time (i.e., transition 211 and 221 are combined as a single transition from hot to cold). In some embodiments, the transitions from hot to cold and back to hot are repeated a plurality of times.

At room temperature, in some embodiments, a nominal X distance 80 between two contacts on chip 90 will equal the corresponding X distance 81 between two corresponding contacts on the top of FC substrate 92, and a nominal X distance 82 between two contacts on PCB 94 will also equal the corresponding X distance 81 between two corresponding contacts on the bottom of FC substrate 92. (In some embodiments, the ball-to-ball distance and the ball size for interface 91 are different from the ball-to-ball distance and the ball size for interface 93.) As PBA 99 is cooled, nominal distance 80 becomes shortened to cooled distance 83, nominal distance 81 is shortened to cooled distance 84, and nominal distance 82 is shortened to cooled distance 85. Where the nominal distances 80, 81, and 82 were equal, the cooled distances 83, 84, and 85 are each different, due to the differing CTEs of the chip 90, FC substrate 92 and PCB 94. Similarly, as PBA 99 is heated, nominal distance 80 is lengthened to heated distance 86, nominal distance 81 is lengthened to heated distance 87, and nominal distance 82 is lengthened to heated distance 88. Typically, distances 86, 87, and 88 are each different from each other and all are longer than the corresponding room temperature distances 80, 81, and 82. Since the heated X distances 86, 87, and 88 seen for the chip 90, the FC substrate 92, and the PCB 94 respectively, at block 210 are all longer than X distances 80, 81, and 82 but slightly unequal one to the others, the mechanical stress is relatively small, and numerous repetitions of the heating, cooling and reheating cycle are required in order to find problems in the PBA 99.

In some embodiments, functional testing, including applying electrical power, providing stimulation signals, and then receiving and analyzing test result signals, is performed at block 210, block 220, and/or block 230.

FIG. 3 is side schematic flowchart of a thermal stratification test procedure 300. Procedure 300 is similar to procedure 200, except that rather than providing a uniform cold, room, or hot environment, a thermally stratified cold-hot or hot-cold environment is provided at the extremes. At block 320 of procedure 300, similar to block 220 of procedure 200, the entire PBA 99 is placed in a chamber at room temperature (about 25 degrees Celsius). A first dual-temperature transition 321 is effected in the chamber (the top of the chamber is made cold, and the bottom of the chamber is made hot) and, in some embodiments, at block 330 the top portion of PBA 99, including its chip 90, chip ball-grid-array interface 91, and flip-chip (FC) substrate 92, is made cold, while printed circuit board (PCB) 94 is made hot, thus exacerbating the mechanical stress on package ball-grid-array interface 93. That is, the top portions of PBA 99 are surrounded by cold surfaces and/or a cold atmosphere. In some embodiments, this atmosphere is stirred or blown in a turbulent flow to enhance a transfer of that cold temperature to PBA 99. Simultaneously the bottom portions of PBA 99 are surrounded by hot surfaces and/or a hot atmosphere, which, in some embodiments, is also stirred or blown. A second dual temperature transition 322 is effected in the chamber and at block 320; again the entire PBA 99 is brought to room temperature. That is, all portions of PBA 99 are surrounded by 25 degrees Celsius surfaces and/or a 25 degrees Celsius atmosphere that is, in some embodiments, stirred or blown in a turbulent flow to transfer that 25 degrees Celsius temperature to PBA 99. A third dual temperature transition 312 is effected in the chamber and at block 310 the top portion of PBA 99 is brought to an elevated temperature (e.g., 50, 80 or 100 degrees Celsius), while simultaneously the bottom portion of PBA 99 is chilled (e.g., 0, −10, or −40 degrees Celsius). A fourth dual temperature transition 311 is effected in the chamber and at block 320 the entire PBA 99 is again brought to room temperature.

In some embodiments, block 310 results in chip 90 having an expanded dimension 86 for chip 90 and an expanded distance 87 for FC substrate 92, but a contracted distance 85 for PCB 94, thus there is more stress on BGA interface 93 than in either block 210 or block 230 of FIG. 2. Similarly, block 330 results in chip 90 having a contracted dimension 83 for chip 90 and a contracted distance 84 for FC substrate 92, but an expanded distance 88 for PCB 94, so there also is more stress on BGA interface 93 at block 330 than in either block 210 or block 230 of FIG. 2.

In some embodiments, transitions 311 and 321 are combined as a single transition from block 310 to block 330, transitions 322 and 312 are combined as a single transition from block 330 to block 310, and the room temperature state represented by block 320 is merely a point along the transitions. In other embodiments, the transition 313 from the top being hot to the top being cold occurs at a different time (either before or after) the transition 314 from the bottom being cold to the bottom being hot. In some embodiments, the transition 315 from the top being cold to the top being hot occurs at a different time (either before or after) the transition 316 from the bottom being hot to the bottom being cold.

Figure 10:
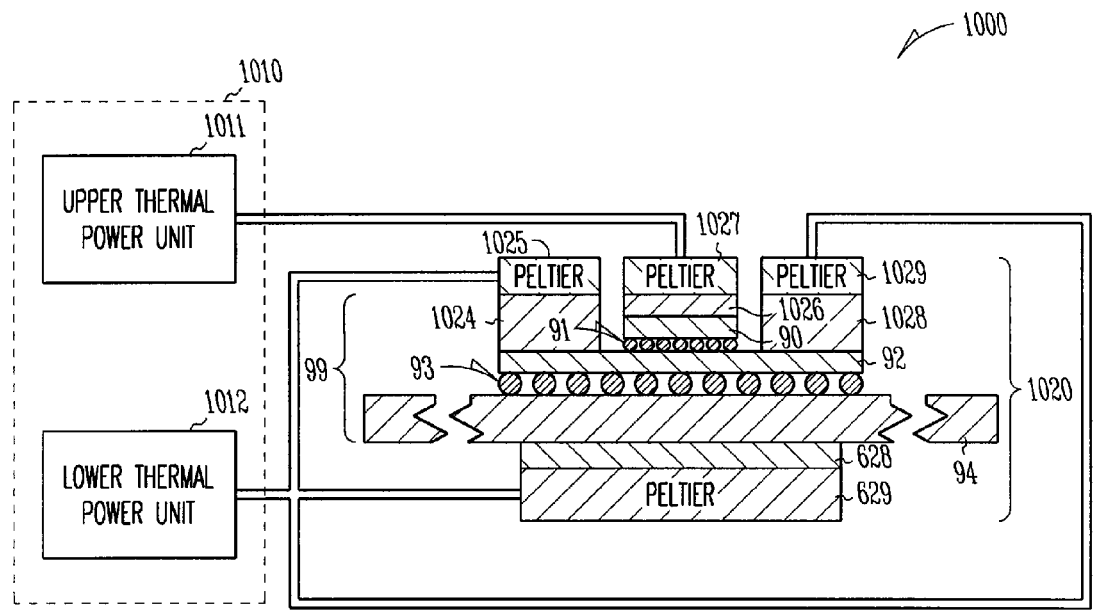
FIG. 10 is side view block diagram of TST system configuration 1000.
Figure 12:
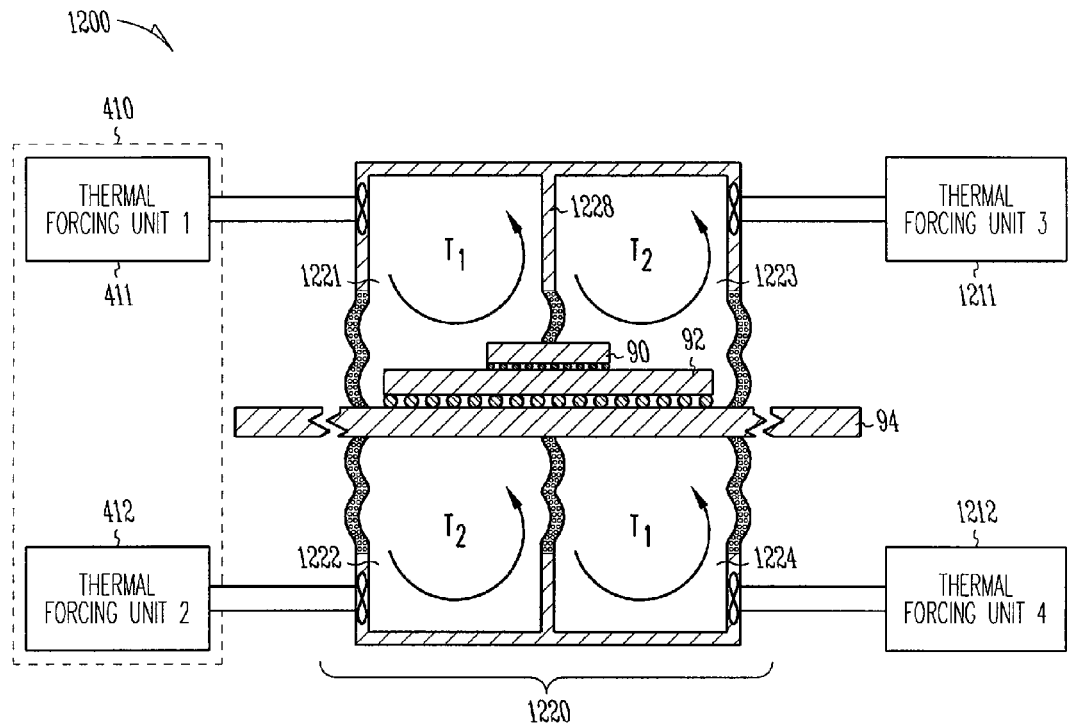
FIG. 12 is side view block diagram of TST system configuration 1200.

In some embodiments, a confinement mechanism or cell shroud is provided so that the top chamber primarily cools/heats only chip 90 using forced turbulent air, and the bottom portions that are heated/cooled include both PCB 94 and FC substrate 92. In other embodiments, such as shown in FIG. 10, the top forcing unit only heats/cools chip 90 using a contact surface, while the lower thermal forcing unit only cools/heats PCB 94 and FC substrate 92. In yet other embodiments, various subportions of the top and bottom are connected to the thermal forcing units, such as shown in FIG. 12, for example.

In some embodiments, functional testing, including applying electrical power, providing stimulation signals, and then receiving and analyzing test result signals, is performed at block 310, block 320, and/or block 330.

Figure 4:
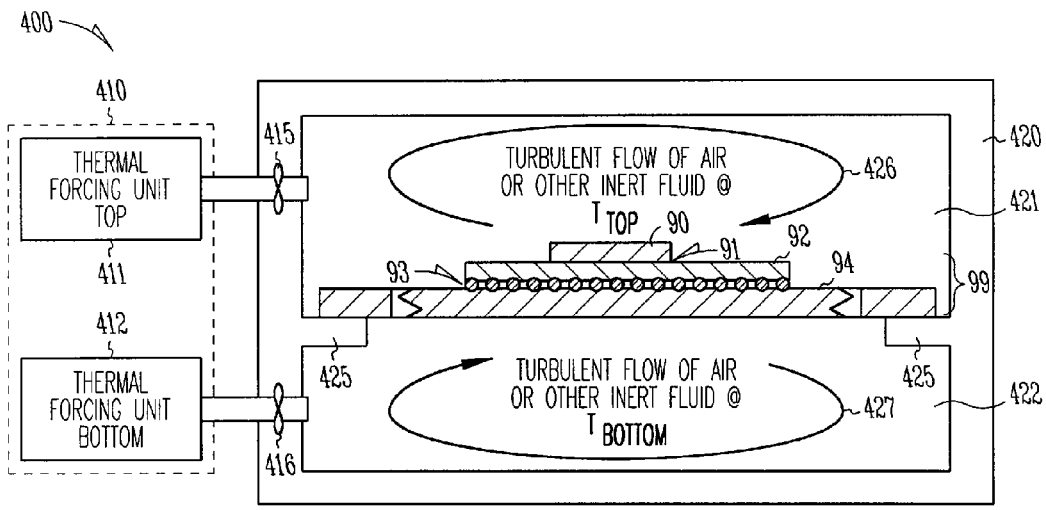
FIG. 4 is side view block diagram of TST system configuration 400.

FIG. 4 is side view block diagram of thermal stratification test (TST) system configuration 400 used in some embodiments. Configuration 400 includes a thermal unit 410 having a thermal forcing unit (TFU) 411 for the top chamber 421 and a thermal forcing unit (TFU) 412 for the bottom chamber 422 of thermal station 420. In some embodiments, a fan 415 or other circulating device stirs or blows the fluid (e.g., air or other suitable inert or electrically non-conductive fluid) in a turbulent flow 426 at a temperature $T_{TOP}$, and a fan 416 or other circulating device stirs or blows the fluid (e.g., also air or other suitable inert or electrically non-conductive fluid) in a turbulent flow 427 at a temperature $T_{BOTTOM}$. In some embodiments, PBA 99 is placed on a rim 425 (e.g., in some embodiments, either covered with or entirely made of a compliant material that forms a seal between upper chamber 421 and lower chamber 422). In some embodiments, enough heat or cold is supplied by the thermal forcing units 411 and 412 that small leaks around seal rim 425 (and/or through vias and other holes in PCB 94) do not significantly affect the desired heating and cooling effects. As described above, in some embodiments, PBA 99 includes a PCB 94, an FC substrate 92, a chip 90, a solder-ball interface 93 connecting PCB 94 to FC substrate 92, and a solder-ball interface 91 connecting FC substrate 92 to chip 90.

In the embodiment shown, the highest stress is expected on interface 93, since when TFU 412 is forcing cold and TFU 411 is forcing heat (and assuming positive CTE values), PCB 94 will contract and FC substrate 92 will expand (or not contract as much), and FC substrate 92 and chip 90 will both expand, although by different amounts typically (or FC substrate 92 will contract and chip 90 will expand), resulting in a smaller stress at interface 91.

In an operational real-use environment, the chip 90 is typically the source of heat and the FC substrate is somewhat cooler, and PCB 94 is even cooler, and the TST (thermal stratification test) configuration emulates such a condition better than thermal tests that heat or cool all layers to about the same temperature. The TST configuration can produce stresses similar in nature to the use environment, but larger in magnitude therefore achieving test acceleration (test time compression.)

Figure 5:
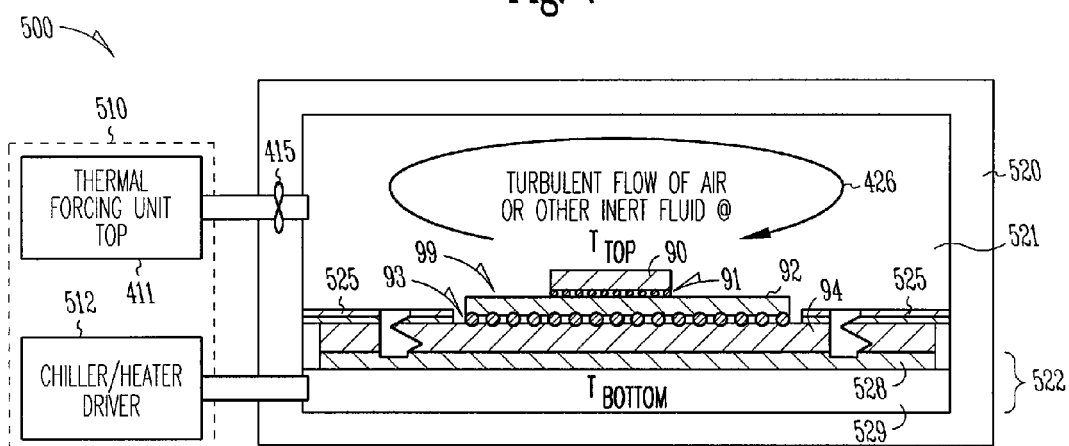
FIG. 5 is side view block diagram of TST system configuration 500.

FIG. 5 is side view block diagram of thermal stratification system configuration 500 used in one embodiment. Configuration 500 includes a thermal station 520 having an upper chamber 521 driven by a thermal forcing unit (TFU) 411 of thermal unit 510 as in FIG. 4; however, this embodiment uses a heating/cooling plate 529 and a compliant thermally conductive and electrically insulating pad 528 to form the lower "chamber" 522 across substantially all of PCB 92. This lower chamber 522 is thermally powered by coolant chiller/heater driver 512 through cable/conduit 517. In some embodiments, heating/cooling plate 529 uses channels to circulate a cooling fluid (such as, for example, a fluorocarbon, ammonia, ethylene glycol or alcohol) during its cooling cycle, and electrical resistance coils (such as Nichrome) for its heating cycle. In other embodiments, a Peltier device (such as shown in FIG. 10) that heats and cools dependent on the direction of current flow is used in place of plate 529. In some embodiments, a heating/cooling plate similar to plate 529 is also used in place of upper chamber 521 as well. In some embodiments, an insulating mask pad 525 is laid over portions of PCB 94, in order to limit the heating and cooling to the portions of interest, e.g., solder balls 91 and solder balls 93 and the surfaces interfacing to them.

Figure 6:
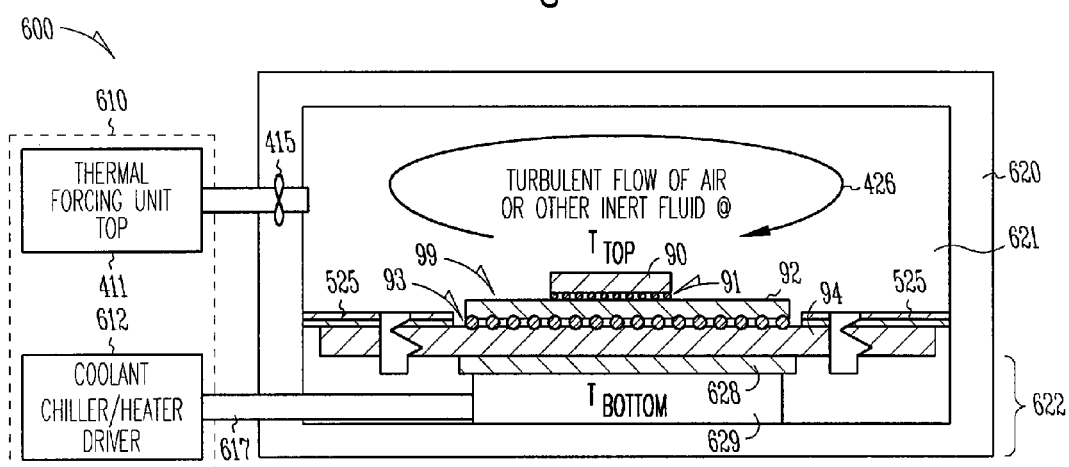
FIG. 6 is side view block diagram of TST system configuration 600.

FIG. 6 is side view block diagram of thermal stratification system configuration 600 used in some embodiments. Configuration 600 includes a thermal station 620 having an upper chamber 621 driven by a thermal forcing unit (TFU) 411 of thermal unit 610 as in FIG. 4, however, this embodiment has chamber 621 surrounding both the top and bottom of PCB 94 at its periphery, and uses a heating/cooling plate 629 and a compliant thermally conductive and electrically insulating pad 628 to form the lower "chamber" 622 across only that portion of PCB 92 that is under FC substrate 92. This small portion of lower chamber 622 is thermally powered by coolant chiller/heater driver 612 through cable/conduit 617 (much like plate 529 of FIG. 5), but the rest of lower chamber 622 has circulating fluid from the top chamber 621. In other embodiments, a Peltier device that heats and cools dependent on the direction of current flow is used in place of plate 629. In some embodiments, a heating/cooling plate similar to plate 529 of FIG. 5 is used in place of upper chamber 621 across substantially all of PBA 99, as well.

Figure 7:
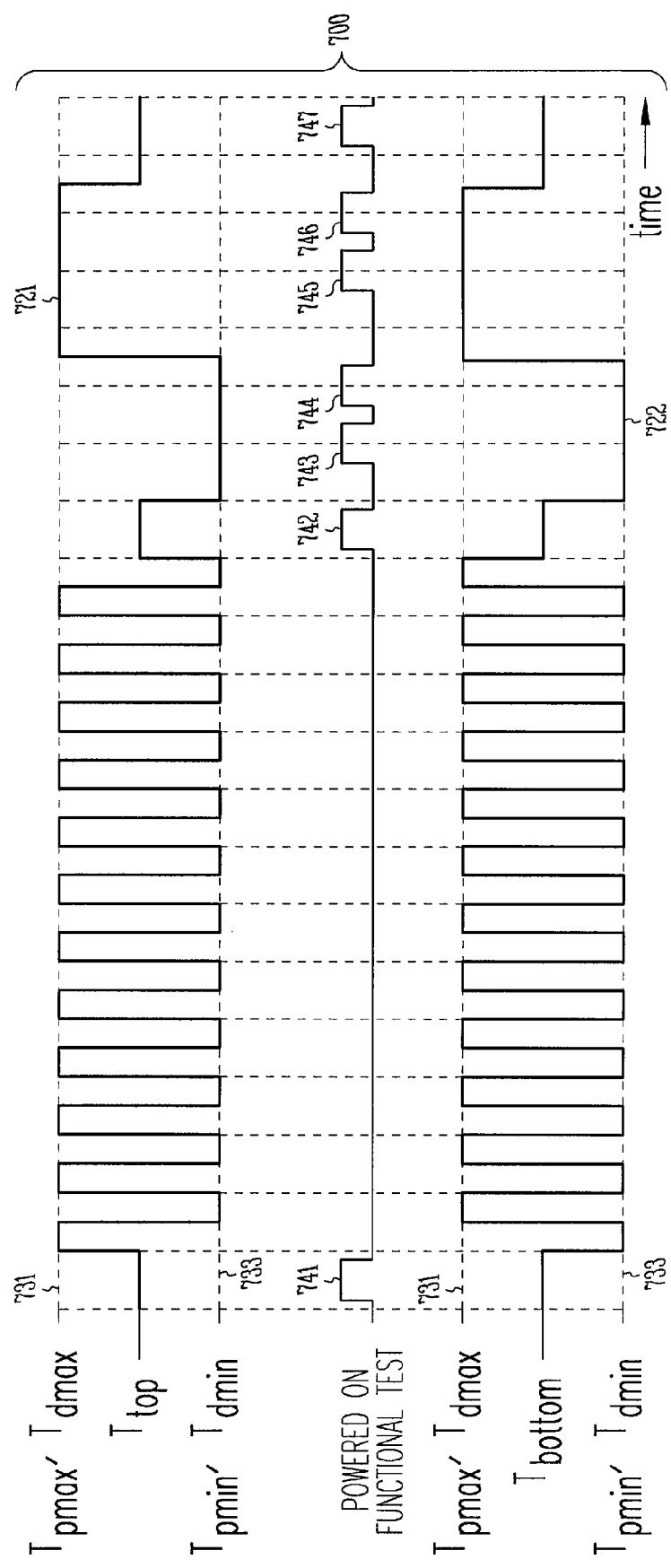
FIG. 7 is a flowchart graph of a procedure 700 used with a TST system.

FIG. 7 is a flowchart graph of a procedure 700 used with a thermal stratification system 900 (see FIG. 9) in some embodiments. Graph line 721 is a plot of temperature vs. time for the top chamber or plate (for FIGS. 4-6, 9-12, 14, 17 and 18), and graph line 722 is a plot of temperature vs. time for the bottom chamber or plate (for FIGS. 4-6, 9-12, 14 and 18). The temperature for graph line 721 alternates between a maximum precipitation temperature Tpmax 731 and a minimum precipitation temperature Tpmin 733, while the temperature for graph line 722 alternates between Tpmin 733 and Tpmax 731, each simultaneously switching to the opposite temperature extreme from the other. In some embodiments, about twelve temperature cycles are used, but in other embodiments, other numbers of cycles are used.

In some embodiments, graph line 740 represents when electrical functional tests are performed (up representing tests being performed, and down representing idle periods). Functional test 741 is performed at room temperature (top and bottom) before temperature cycling is performed, to check that the device is initially functional. Functional test 742 is performed at room temperature (top and bottom) after temperature cycling is performed, to check that the device is functional after temperature cycling. Functional tests 743 and 744 are performed at a minimum detection temperature Tdmin (top and bottom in this embodiment being at temperature 733) after temperature cycling is performed, to check that the device is functional in a cold environment after temperature cycling. Functional tests 745 and 746 are performed at a maximum detection temperature Tdmax (top and bottom, in this embodiment being at temperature 731) after temperature cycling is performed, to check that the device is functional in a hot environment after temperature cycling.

In some embodiments, functional test 747 is performed at room temperature (top and bottom) after temperature cycling is performed, to check that the device is functional after temperature cycling. In some embodiments, the functional tests 742-747 are performed in the order shown, but in other embodiments, other orders are used. In other embodiments, at least some of the functional tests are performed under steady-state thermal-stratification-test conditions (e.g., 842 and 843 of FIG. 8), wherein at least some of the functional tests are performed during the times when the top and bottom temperatures are out-of-phase (i.e., either the device's top is hot and its bottom is cold as in functional test 842, or the top is cold and bottom is hot while functional test 843 is performed). One advantage of performing this thermally out-of-phase functional test is to mechanically "load" the PBA interfaces with additional stresses above and beyond those obtained under conventional uniformly hot/cold functional testing. The additional mechanical loading of the interfaces makes precipitation and detection of intermittent solder joint defects such as solder ball microcracks more probable, by forcing an intermittent connection to stay open while functional test (error detection) is performed (i.e., testing a connection that would open only under thermal stratification (a hot/cold or cold/hot temperature condition), but which would close again once thermal equivalence (i.e., a hot/hot, cold/cold, or room/room temperature condition) was restored).

Note that microcracks parallel to the plane of the PCB (i.e., cracks in the solder ball that are parallel to the face of the PCB) are often the most troublesome form of solder defect to detect in a manufacturing environment, since the crack in the connection can close when the temperature stress is removed or changed. In some embodiments, steady-state TST is able to fill this gap in conventional PBA manufacturing test technology (since thermal stratification can hold such cracks open during the functional test); hence, it provides high value. Further, one advantage of cyclical TST combined with steady-state TST is that cyclical TST precipitates many marginal or partial defects to full defects. Then, steady-state TST detects these precipitated defects. These defects would have been previously undetectable using conventional methods.

Figure 8:
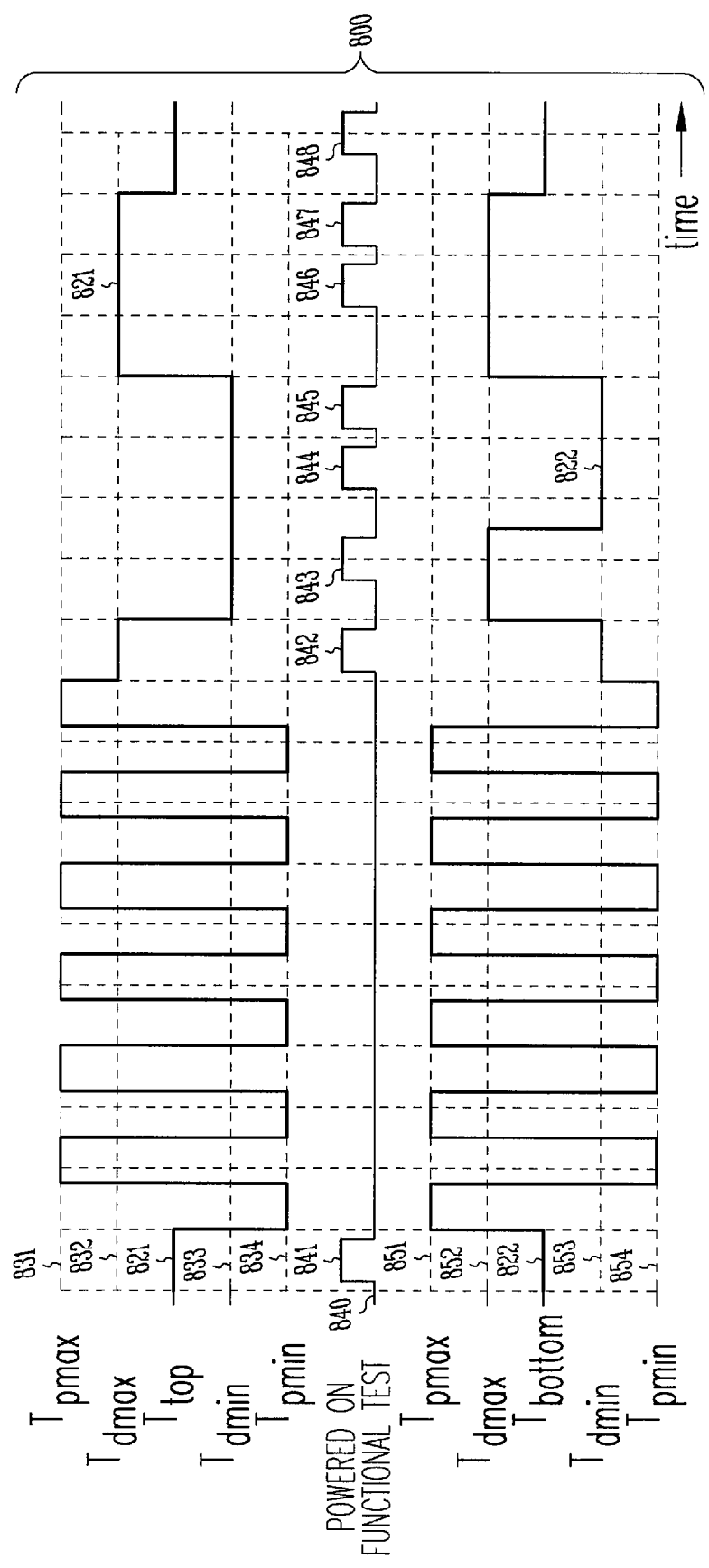
FIG. 8 is a flowchart graph of a procedure 800 used with a TST system.

In some embodiments, Tpmax is equal to Tdmax and Tpmin is equal to Tdmin, but in other embodiments, Tdmax is different from Tpmax (such as shown in FIG. 8), and Tdmin is different from Tpmin. In some embodiments, the Tpmax for both $T_{TOP}$ and $T_{BOTTOM}$ are the same as shown, while in other embodiments, the Tpmax for the top chamber or plate is different than the Tpmax used for the bottom chamber or plate. Similar rules apply for the Tpmin and Tdmin values of $T_{TOP}$ and $T_{BOTTOM}$ chamber temperatures.

FIG. 8 is a flowchart graph of a procedure 800 used with a thermal stratification system 900 (see FIG. 9) in some embodiments. In some embodiments, the temperature cycling for procedure 800 is much the same as for procedure 700 of FIG. 7, however the Tpmax 831 is hotter than Tdmax 832 for the top side, Tpmax 851 is hotter than Tdmax 852 for the bottom side, Tpmin 834 is colder than the Tdmin 833 for the top side, and the Tpmin 854 is colder than the Tdmin 853 for the bottom side. In some embodiments, the maximum and minimum temperatures for top and bottom are the same respective temperatures (i.e., Tpmax 831=Tpmax 851, Tdmax 832=Tdmax 852, Tdmin 833=Tdmin 853, and Tpmin 834=Tpmin 854), while in other embodiments, different maximum and minimum temperatures are used for top and bottom. Graph line 821 represents that temperature versus time plot for the top chamber (e.g., chamber 421 of FIG. 4), and graph line 822 represents that temperature versus time plot for the bottom chamber (e.g., chamber 422 of FIG. 4).

In some embodiments, functional testing is performed during steady-state thermal stratification (also called "steady-state TST"), i.e., functional testing while the $T_{TOP}$ and $T_{BOTTOM}$ are maintained at Tdmin/Tdmax out of phase (either hot/cold as in test 842 or cold/hot as in test 843 of FIG. 8). In some embodiments, a steady-state functional TST is performed alone (i.e., without previously performing thermal cycling), and in other embodiments, a cyclic TST (i.e., thermal stratification cyclically alternated to precipitate a failure mode) is performed, followed by a steady-state TST (functional testing performed while the device is held in thermal stratification)

In some embodiments, graph line 840 represents when electrical functional tests are performed. Functional test 841 is performed at room temperature (in both top and bottom chambers) before temperature cycling is performed, to check that the device is initially functional. In some embodiments, functional test 842 is performed at Tdmax temperature for the top chamber (e.g., 421 of FIG. 4) and Tdmin temperature for the bottom chamber (e.g., 422 of FIG. 4) after temperature cycling is performed, to check that the device is functional (in a hot/cold configuration) after temperature cycling. Functional test 843 is performed at Tdmin temperature for the top chamber (e.g., 421 of FIG. 4) and Tdmax temperature for the bottom chamber (e.g., 422 of FIG. 4) after temperature cycling is performed, to check that the device is functional (in a cold/hot configuration), called thermal stratification functional testing, after temperature cycling. Functional tests 844 and 845 are performed at a minimum detection temperature Tdmin 833 (top and bottom) after temperature cycling is performed, to check that the device is functional in a cold/cold environment after temperature cycling. Functional tests 846 and 847 are performed at a maximum detection temperature Tdmax (top and bottom) after temperature cycling is performed, to check that the device is functional in a hot/hot environment after temperature cycling. Functional test 848 is performed at room temperature (top and bottom) after temperature cycling is performed, to check that the device is functional after temperature cycling. In some embodiments, the functional tests 842-848 are performed in the order shown, but in other embodiments, other orders are used.

Figure 9:
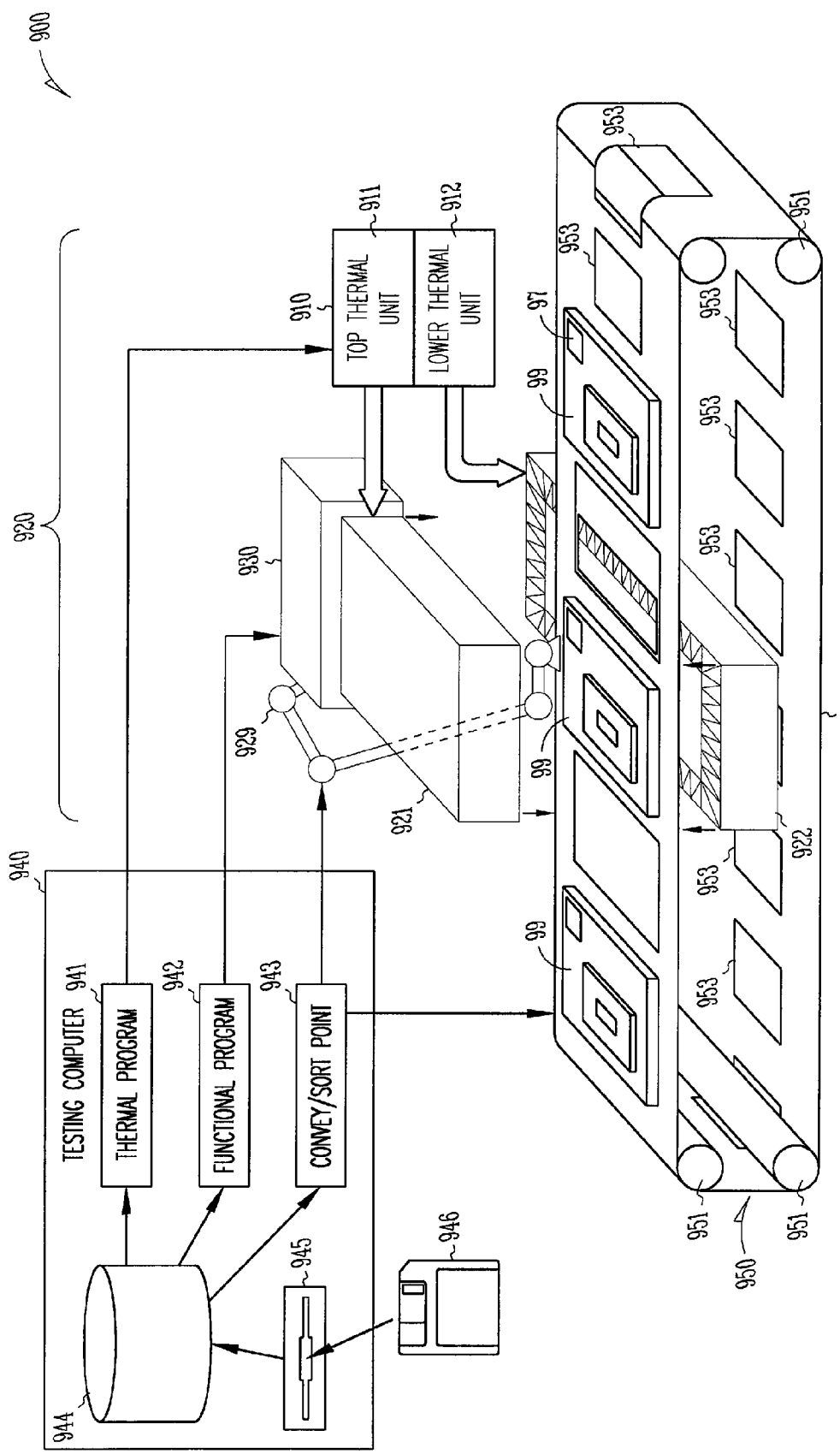
FIG. 9 is schematic a thermal stratification test system 900.

FIG. 9 is schematic a thermal stratification test system 900 used in some embodiments. System 900 includes a testing controller or information processing system (IPS) 940 (such as a programmable computer, or a hardwired logic circuit) that controls the top thermal unit 911 and the bottom thermal unit 912 of thermal controller 910. IPS 940 is also operative coupled to electrical connector 930 to transmit power and stimulation signals and/or clocks and to receive test results signals to one or more of the devices under test (DUTs) (e.g., PBA 99) carried on conveyer system 950. In some embodiments, conveyer 950 (e.g., a belt 952 having holes 953 and running around motorized rollers 951 that are controlled by ISP 940 via conveyor/sort program 943) moves a series of DUTs 99 one after another to thermal/functional station (TFS) 920. In other embodiments, each PBA 99 is manually loaded into TFS 920. In some embodiments, TFS 920 includes upper chamber 921 and lower chamber 922 such as shown as thermal stations 420 of FIG. 4, 520 of FIG. 5, 620 of FIG. 6, 1020 of FIG. 10, 1120 of FIG. 11, or 1220 of FIG. 12. In some embodiments, once a PBA 99 is moved in place at station 920, a robotic actuator 929 move the top unit 921 down and the bottom unit 922 up into place around the selected PBA 99. Thermal program 941 then controls the thermal cycling as described for FIGS. 7 and 8 above. Functional program 942 controls the transmitting (as described in FIGS. 7 and 8) of power and stimulation signals and/or clocks and the reception of test results signals through electrical connector 930 connected to connector 97 on the selected PBA 99. In some embodiments, robotic sorting of the PBAs based on the functional test results is controlled by convey/sort program 943. In some embodiments, the software for thermal program 941, functional program 942, and/or convey/sort program 943 is obtained on computer-readable media 946 (such as a diskette, CDROM, or an internet download connection) that is connected to a suitable input device 945 and then optionally stored to storage 944. Some embodiments substitute manual processes for one or more operations described above.

FIG. 10 is side view block diagram of a thermal stratification system configuration 1000 used in some embodiments. In the embodiment shown, Peltier device 1027 heats and cools only chip 90 as controlled by upper thermal unit 1011 of thermal controller 1010, while Peltier devices 1025, 1029, and 629 cool and heat the outer portions of FC substrate 92 and PCB 94. Configuration 1000 places the highest mechanical stress on interface 91 rather than interface 93, as was the case for FIGS. 4-6. Compliant pads 1024, 1026, 1028 and 628 are thermally conductive and electrically insulating.

Figure 11:
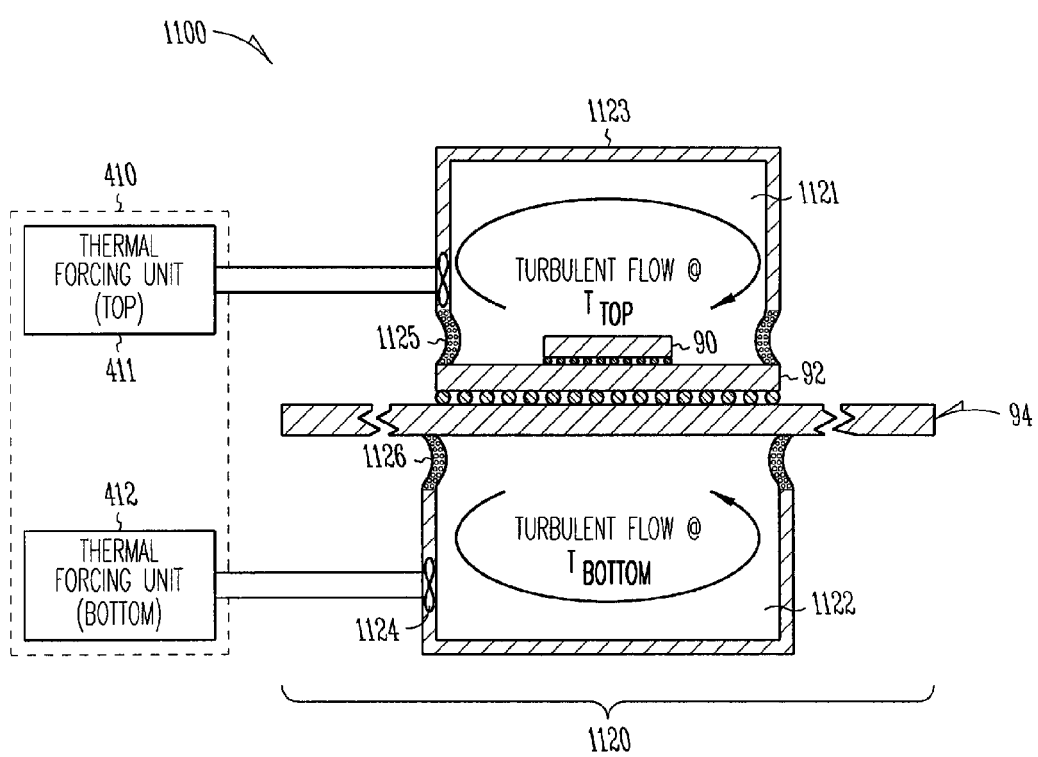
FIG. 11 is side view block diagram of TST system configuration 1100.

FIG. 11 is side view block diagram of a thermal stratification system configuration 1100 used in some embodiments. Configuration 1100 is the same as configuration 400 of FIG. 4, except that the thermal chamber 1120 includes a cup-like upper chamber 1123 having a compliant lip 1125 that presses against FC substrate 92 to enclose a chamber 1121 in place of the upper chamber 421 of FIG. 4. Similarly, a cup-like lower chamber 1124 having a compliant lip 1126 that presses against PCB 94 around an area corresponding to the perimeter of FC substrate 92 to enclose a chamber 1122 in place of the lower chamber 422 of FIG. 4. In some embodiments, the upper chamber 1123 is placed against the perimeter of only chip 90 (in some embodiments, against the top surface, and in other embodiments, along the sides of chip 90 but against FC substrate 92 to enclose substantially only chip 90), in order that the greatest thermal difference and thus the highest mechanical stress is on interface 91 rather than interface 93, as was the case for FIGS. 4-6.

FIG. 12 is side view block diagram of a thermal stratification system configuration 1200 used in some embodiments. In this embodiment, thermal forcing unit (TFU) 411 controls the upper left chamber 1221 of TST station 1220, TFU 1212 controls the lower right chamber 1224, while thermal forcing unit 412 controls the lower left chamber 1222 and TFU 1211 controls the upper right chamber 1223. Configuration 1200 provides a thermal stratification top-to-bottom (T1 to T2) by the temperature difference between chamber 1221 and 1222 (as well as T2 to T1 between 1223 and 1224), and a left-to-right thermal stratification by the temperature difference between chamber 1221 and 1223 (as well as between 1222 and 1224). In some embodiments, the dividing wall 1228 between chambers 1221 and 1223 is pressed down the middle of chip 90 to induce stresses there. In some embodiments, a solely left-to-right thermal stratification is achieved by connecting chambers 1221 and 1222 to thermal forcing unit 411 and connecting chambers 1223 and 1224 to thermal forcing unit 412. Still other embodiments include only the top two chambers 1221 and 1223 connected to the thermal forcing units as shown, and omitting the lower chambers 1222 and 1224, in order to have only left-to-right thermal stratification on chip 90 and FC substrate 92.

Figure 13:
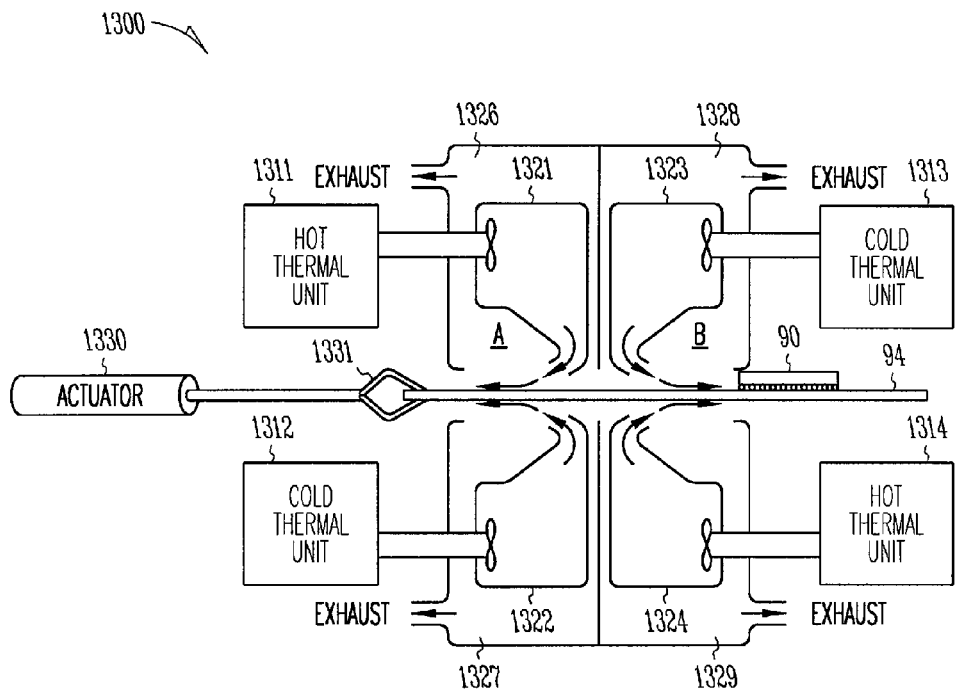
FIG. 13 is side view block diagram of TST system configuration 1300.

FIG. 13 is side view block diagram of a thermal stratification system configuration 1300 used in some embodiments. In some embodiments, hot thermal unit 1311 controls the upper left chamber of source plenum 1321 and collection enclosure 1326 and the lower right chamber of source plenum 1324 and collection enclosure 1329, while in other embodiments such as the embodiment shown, a separate hot thermal unit 1314 controls the lower right chamber of plenum 1324. In some embodiments, cold thermal unit 1312 controls the upper right chamber of source plenum 1323 and collection enclosure 1328 and the lower left chamber of source plenum 1322 and collection enclosure 1327, while in other embodiments such as the embodiment shown, a separate cold thermal unit 1313 controls the upper left chamber of plenum 1323. Actuator 1330 is attached to grasper 1331, which in turn holds PCB 94. In the embodiment shown, chip 90 is directly attached to PCB 94. Actuator 1330 moves PCB 94 to alternately move chip 90 from station A (hot on top and cold on bottom using the chambers of enclosures 1326 and 1327 respectively) to station B (cold on top and hot on bottom using the chambers of enclosures 1328 and 1329 respectively). In some embodiments, the hot thermal unit 1311 and the cold thermal unit 1312 are turned off when the chip 90 is in station B as shown (no heating or cooling provided at station A), and only cold thermal unit 1313 and hot thermal unit 1314 are activated. Then, the hot thermal unit 1311 and the cold thermal unit 1312 are activated when the chip 90 is in station A (actuator 1330 having pulled PCB 94 to the left, and cold thermal unit 1313 and hot thermal unit 1314 are turned off (no heating or cooling provided at station B).

Configuration 1300 can alternatively provide a top-to-bottom thermal stratification by the temperature difference between chamber 1321 and 1322 (as well as between 1323 and 1324), and a left-to-right thermal stratification by the temperature difference between chambers 1321 and 1323 (as well as between 1322 and 1324) as shown in FIG. 12. In other embodiments, further chambers are provided besides those shown, in order to provide a hot top and hot bottom, or a cold top and cold bottom, or a room temperature top and room temperature bottom chambers.

Figure 14:
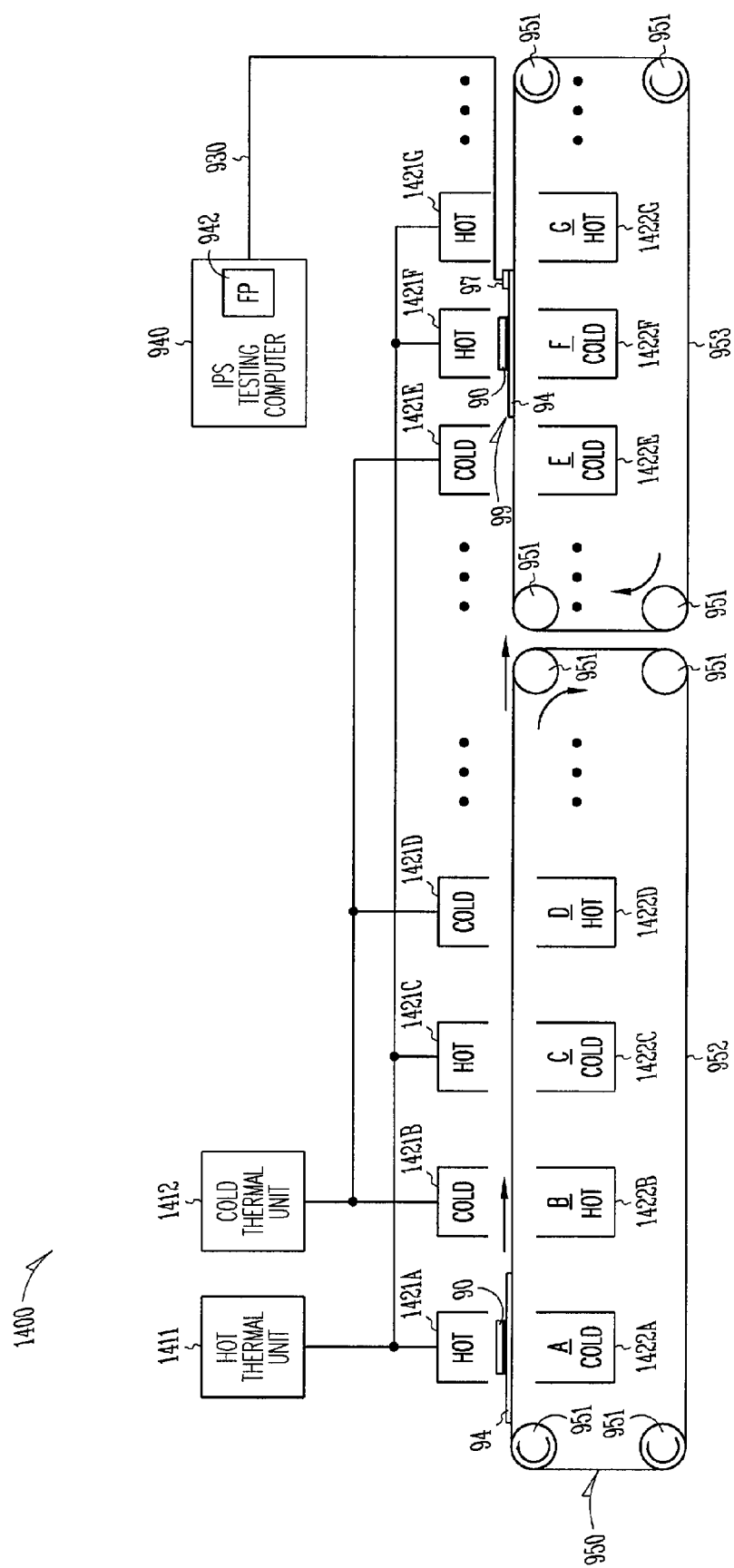
FIG. 14 is side view block diagram of TST system configuration 1400.

FIG. 14 is side view block diagram of a thermal stratification system configuration 1400 used in some embodiments. System configuration 1400 includes a series of hot/cold, cold/hot, hot/hot, cold/cold, and/or room/room temperature stratification stations or cells through which the device under test (DUT) is sequentially passed. System 1400 allows rapid sequential processing of a single PBA 99 or a plurality of PBAs 99 one after another. Thus, hot/cold station A is hot on the top via chamber 1421A and cold on the bottom via chamber 1422A. Similarly, cold/hot station B uses chambers 1421B and 1422B; hot/cold station C uses chambers 1421C and 1422C; and cold/hot station D uses chambers 1421D and 1422D. In various different embodiments, a chosen number and size of chambers are provided to meet design and testing needs. In some embodiments, just two cells are provided (or any other suitable number and configuration of cells), a hot/cold cell and a cold/hot cell, and conveyor section 952 is reversible to allow a PBA or a portion thereof to be repeatedly cycled back and forth between them. In some embodiments, cold/cold station E uses chambers 1421E and 1422E; hot/hot station F uses chambers 1421F and 1422F; and hot/hot station G uses chambers 1421G and 1422G. In some embodiments, all of the hot chambers are supplied with blown hot air from hot thermal unit 1411, and all of the cold chambers are supplied with blown cold air from cold thermal unit 1412. Adjusting or setting the sizes of the individual cells, the number of cells, and the speed of the conveyor 950 determines the shape of the graph of temperature stratifications. In some embodiments, conveyor 950, which runs around rollers 951 (some of which are motorized, in some embodiments) includes a plurality of sections 952 and 953 that are run at different speeds, so that the time per cell can be further varied for the different sections.

In some embodiments, IPS testing computer 940 includes a functional program 942 that controls the transmitting (as described in FIGS. 7 and 8) of power and stimulation signals and/or clocks and the reception of test results signals through electrical connector 930 connected to connector 97 on the selected PBA 99. In some embodiments, functional testing occurs only in cold/cold cell E, hot/cold cell F, and hot/hot cell G, as well as at room temperature. In other embodiments, functional steady-state thermal-stratification functional testing is performed in one or more other TST (thermal stratification test) cells such as cells A through D.

In some embodiments, TST is used to test chip packaging as described above. In various other embodiments, thermally stratified cycling and steady-state thermally stratified functional testing is performed during testing of some or all of the following features of computer systems: probe heads, manual cable or card insertion, automated cable or card insertion, host personal computer assist, diagnostic software, data-collection systems, etc.

Figure 15:
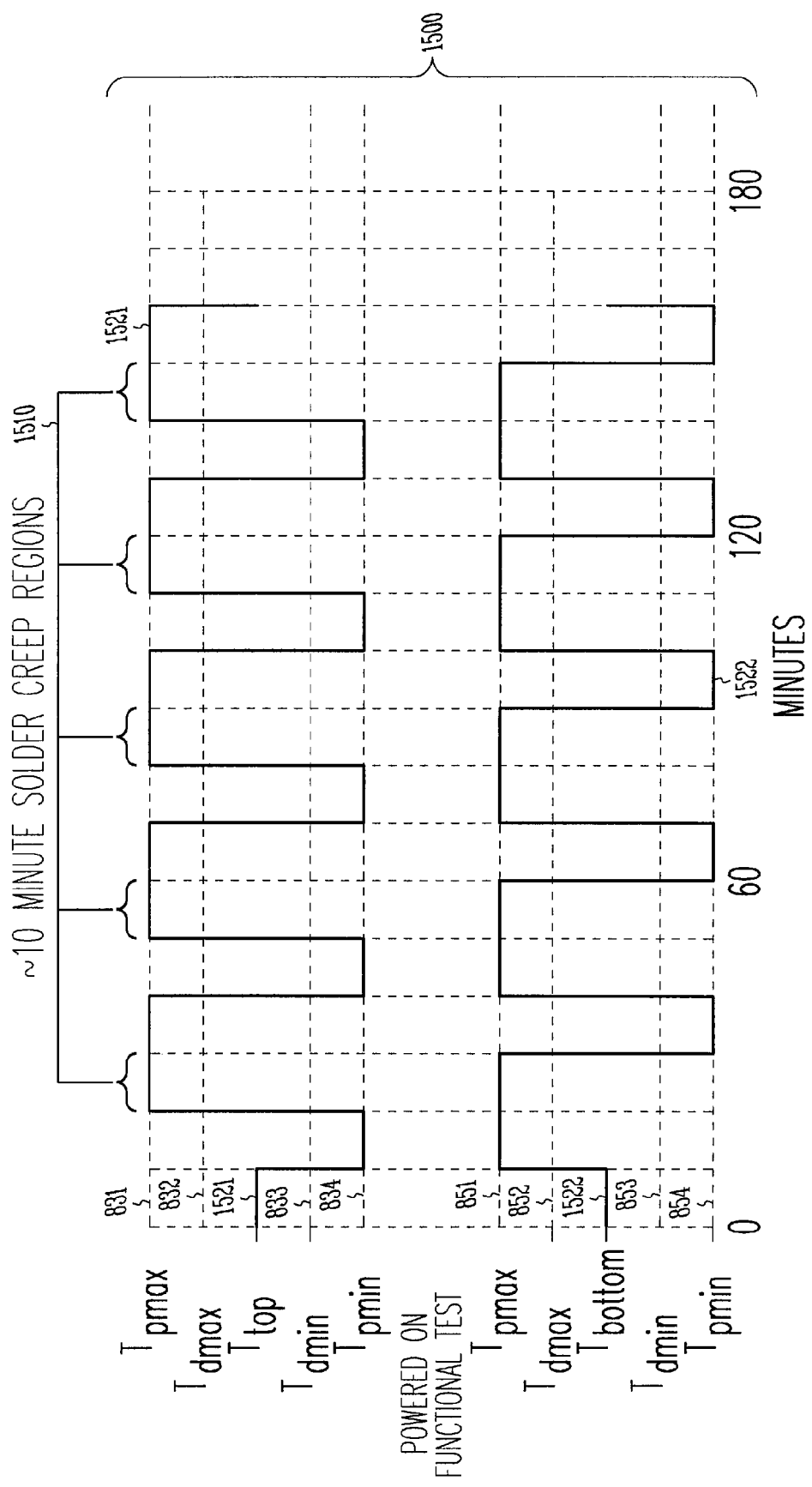
FIG. 15 is a flowchart graph of a procedure 1500 used with a TST system 900.

FIG. 15 is a flowchart graph of a procedure 1500 used with a thermal stratification system 900 (see FIG. 9) in some embodiments, particularly to perform longer-term reliability testing, and/or particularly to test for solder-creep problems. In some embodiments, the temperature cycling for procedure 1500 is much the same as for procedure 700 of FIG. 7 and procedure 800 of FIG. 8, however for a plurality of the test cycles both sides of the device (e.g., top and bottom) are brought to Tpmax 831 and 851, respectively, just before taking one side or the other to Tpmin 834 or 854, respectively. Graph line 1521 represents that temperature versus time plot for the top chamber (e.g., chamber 921 of FIG. 9), and graph line 1522 represents that temperature versus time plot for the bottom chamber (e.g., chamber 922 of FIG. 9). Thus, with both sides at their respective Tpmax 831 and 851, the hot solder is given time (e.g., about ten minutes for each solder creep period 1510, in some embodiments) to creep to a relaxed configuration and then rather suddenly, the bottom side is cooled Tpmin 854, thus placing additional mechanical stress on the solder-ball joints. In some embodiments, a large number of temperature fluctuations are performed (e.g., days or weeks of testing of a repeated series of cycles).

In some embodiments, functional testing is performed during steady-state thermal stratification (also called "steady-state TST"), i.e., functional testing while the $T_{TOP}$ and $T_{BOTTOM}$ are maintained at Tdmin/Tdmax out of phase, at the end of the extended period of temperature cycles.

Figure 16:
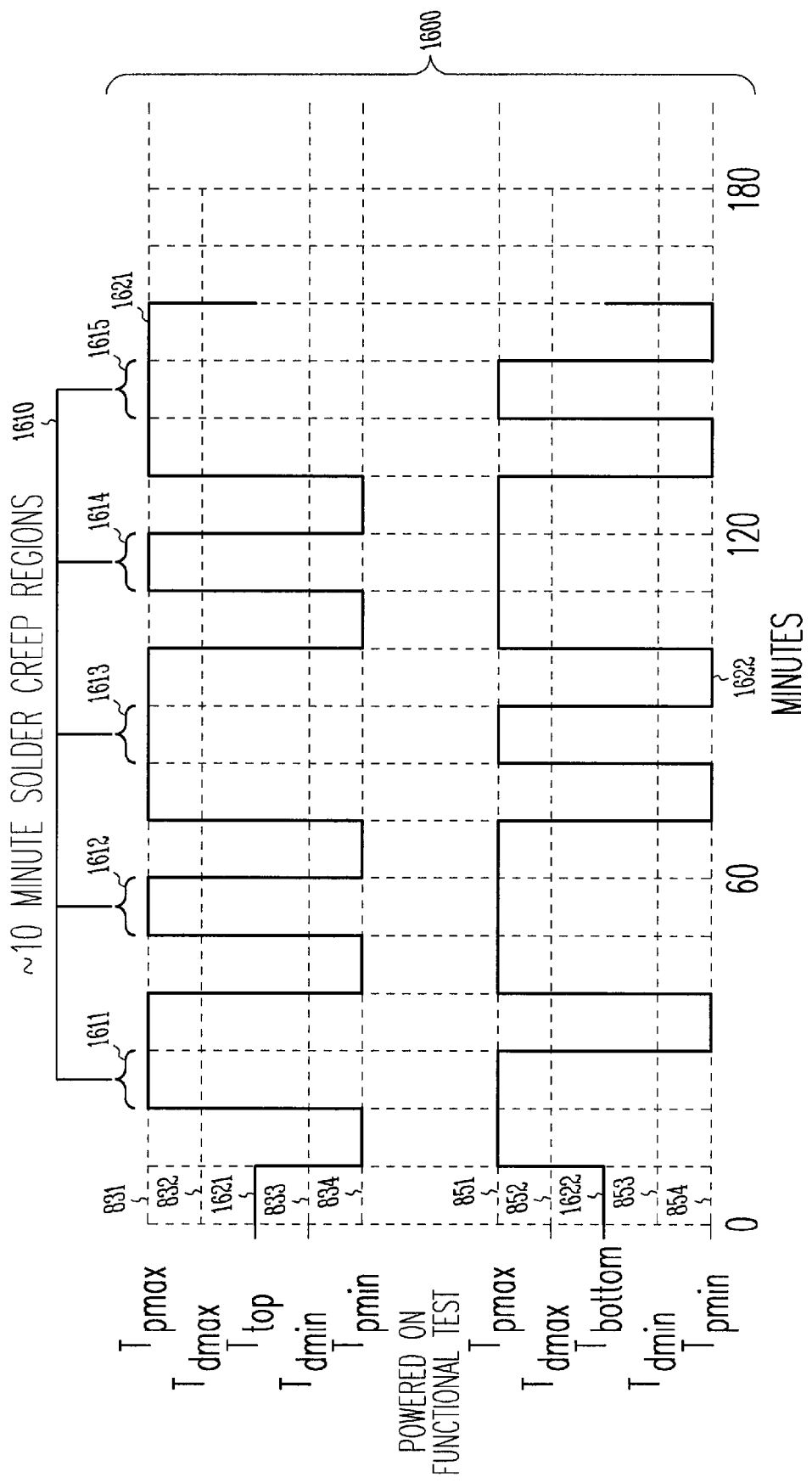
FIG. 16 is a flowchart graph of a procedure 1600 used with a TST system 900.

FIG. 16 is a flowchart graph of a procedure 1600 used with a thermal stratification system 900 (see FIG. 9) in some embodiments, also particularly to perform longer-term reliability testing, and/or particularly to test for solder-creep problems. Graph line 1621 represents that temperature versus time plot for the top chamber (e.g., chamber 921 of FIG. 9), and graph line 1622 represents that temperature versus time plot for the bottom chamber (e.g., chamber 922 of FIG. 9). Thus, with both sides at their respective Tpmax 831 and 851, the hot solder is given time (e.g., about ten minutes for each solder creep period 1510, in some embodiments) to creep to a relaxed configuration and then rather suddenly, the bottom side is cooled Tpmin 854 (after periods 1611, 1613, and 1615), and after alternate periods 1612 and 1614 the top side is cooled to Tpmin 834, thus placing additional alternating mechanical stress on the solder-ball joints. Again, in some embodiments, a large number of temperature fluctuations are performed (e.g., days or weeks of testing of a repeated series of cycles).

Figure 17:
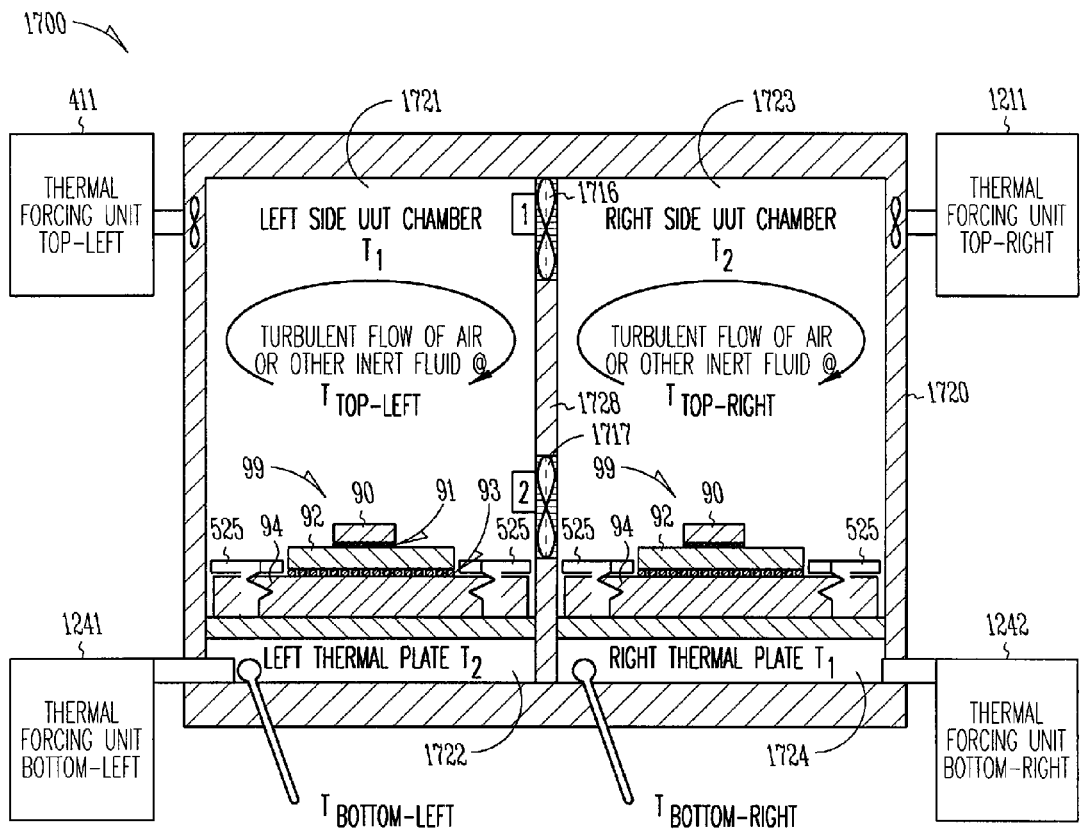
FIG. 17 is side view block diagram of TST system configuration 1700.

FIG. 17 is side view block diagram of a thermal stratification system configuration 1700 used in some embodiments. In this embodiment, thermal forcing unit (TFU) 411 controls the upper left chamber 1721 of TST station 1220, TFU 1742 controls the lower right thermal plate 1724, while thermal forcing unit 1241 controls the lower thermal plate 1722 and TFU 1211 controls the upper right chamber 1723. Configuration 1700 provides a thermal stratification top-to-bottom (T1 to T2) by the temperature difference between chamber 1721 and plate 1722 (as well as T2 to T1 between chamber 1723 and plate 1724), and a left-to-right thermal stratification by the temperature difference between chambers 1721 and 1723 (as well as between plates 1722 and 1724). In some embodiments, the dividing wall 1728 between chambers 1221 and 1223 includes selectively operable cross ventilation fans 1716 and 1717 used to exchange air during the transitions from hot-cold to cold-hot in order to improve temperature change efficiency. In some embodiments, the operation of system configuration 1700 is the same as for configuration 1200 of FIG. 12. In some embodiments, separate PBAs 99 are placed in the left and right chambers. In other embodiments, a single PBA 99 having two portions of interest is place in both chambers, such that one portion of interest is in the left chamber and the other is in the right chamber.

Figure 18:
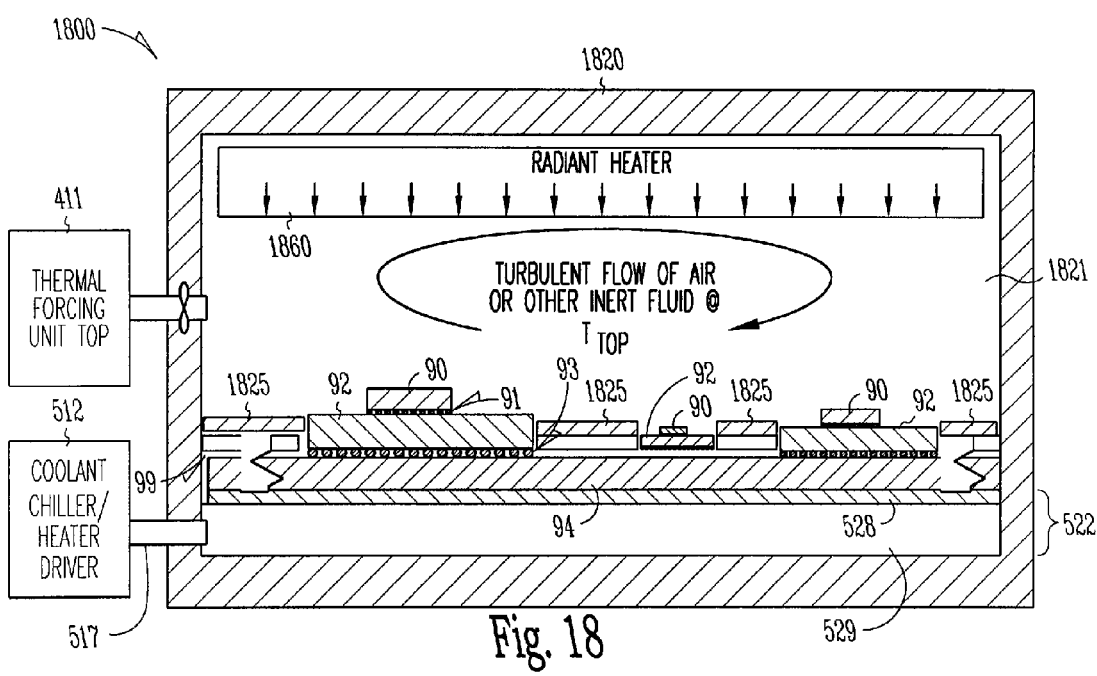
FIG. 18 is side view block diagram of TST system configuration 1800.

FIG. 18 is side view block diagram of thermal stratification system configuration 1800 used in one embodiment. Configuration 1800 includes a thermal station 1820 having an upper chamber 1821 driven by a thermal forcing unit (TFU) 411 as in FIG. 5 and a heating/cooling plate 529 and a compliant thermally conductive and electrically insulating pad 528 to form the lower "chamber" 522 across substantially all of PCB 94. This lower chamber 522 is thermally powered by coolant chiller/heater driver 512 through cable/conduit 517. Operation is the same as for FIG. 5. In some embodiments, a thermally insulating mask pad 1825 having a plurality of openings is laid over portions of PCB 94, in order to limit the heating and cooling to the portions of interest, e.g., the plurality of chips 90, and the solder balls 91 and solder balls 93 and the surfaces interfacing to them. In some embodiments, a radiant heater 1860 is provided to supplement the heating of chips 90, and in some such embodiments, the top surface of insulating pad 1825 is made reflective (e.g., with a foil top surface). In these embodiments, the thermal stratification is concentrated to mostly affect the chips 90 and the PCBs 92 and the solder balls 91 and 93, while having less effect on the rest of PBA 99

Figure 19:
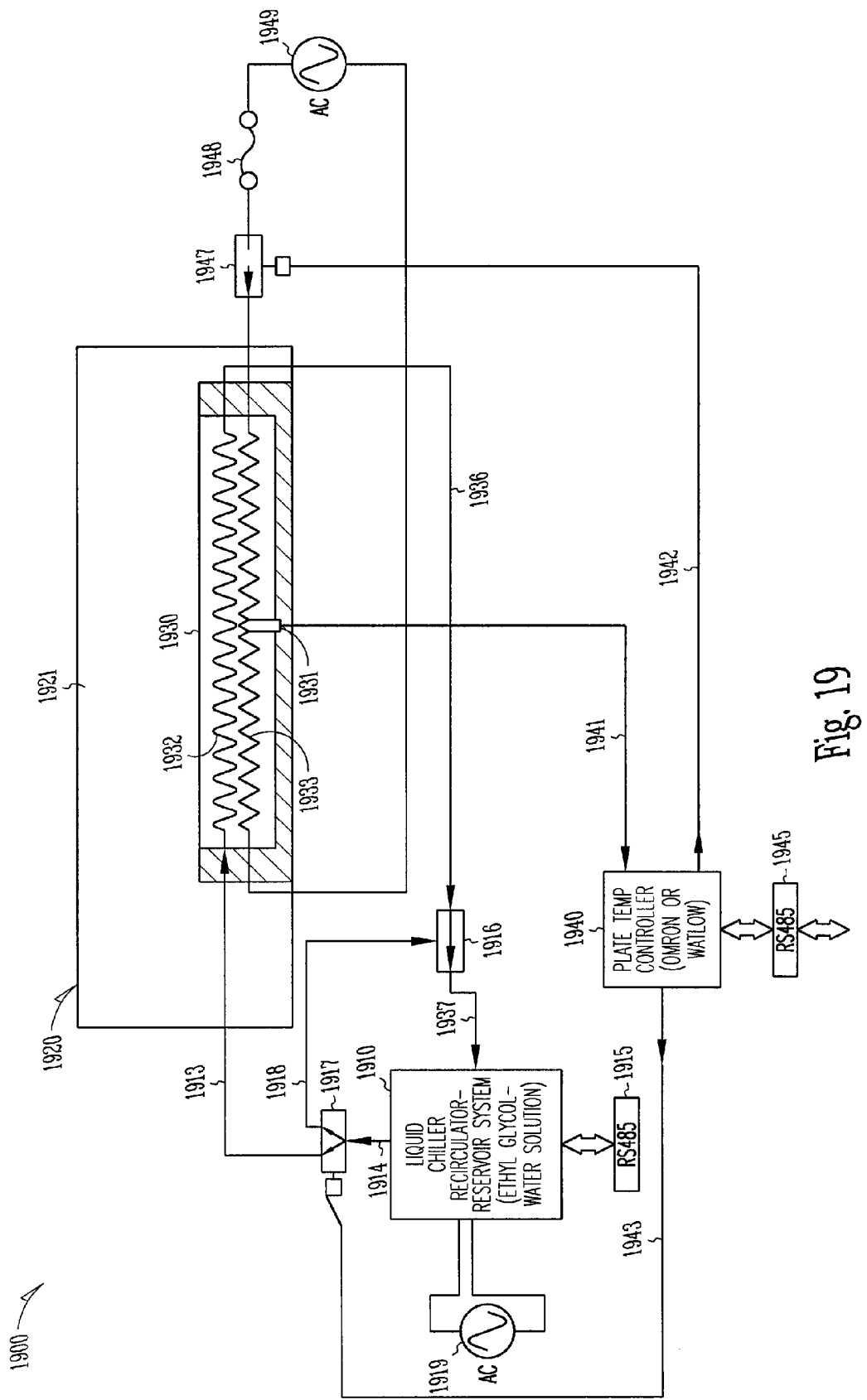
FIG. 19 is schematic a thermal stratification test control system 1900.

FIG. 19 is schematic a thermal stratification test control system 1900 used in one embodiment. System 1900 includes a thermal station 1920 having a thermal plate 1930 (in a configuration as would be used in FIG. 5). System 1900 includes a liquid chiller/recirculator/reservoir system 1910 which pumps out 1914 chilled liquid (e.g., at −20 degrees C.). Plate temperature controller 1940 (in some embodiments, such as made by Omron or Watlow) provides "cool-ON" control signal 1943, which controls valve 1917 to either path 1913 through plate 1930, or to bypass loop 1918. In some embodiments, valve 1917 is an either-or valve, while in other embodiments, a proportional valve is used. Communications port 1915 (in some embodiments, using RS 485 protocol) allows control signals to control the operation of system 1910, and AC power 1919 provides chiller/recirculator power. The liquid that passes through path 1913 goes through thermal plate 1930 (in some embodiments, made of copper and/or aluminum) to cool it, and then returns by path 1936 to junction 1916, where it joins with liquid from bypass loop 1918 and goes by path 1937 back to system 1910. In some embodiments, plate temperature controller 1940 also provides "heat-ON" control signal 1942, which controls electrical switch 1947, which controls whether or not (or how much) power from source 1949 (passing through fuse 1948) is applied to resistance heaters 1933 (in some embodiments, embedded cartridge heaters such as Watlow FIRERODs, from Watlow Electric Manufacturing are used). In some embodiments, communications port 1945 (in some embodiments, using RS 485 protocol) allows control signals to control the operation of plate temperature controller 1940. In some embodiments, control of the temperature and circulation of upper chamber 1921 is conventional such as used in an Espec thermal chamber (e.g., from ESPEC NORTH AMERICA, INC.).

Figure 20:
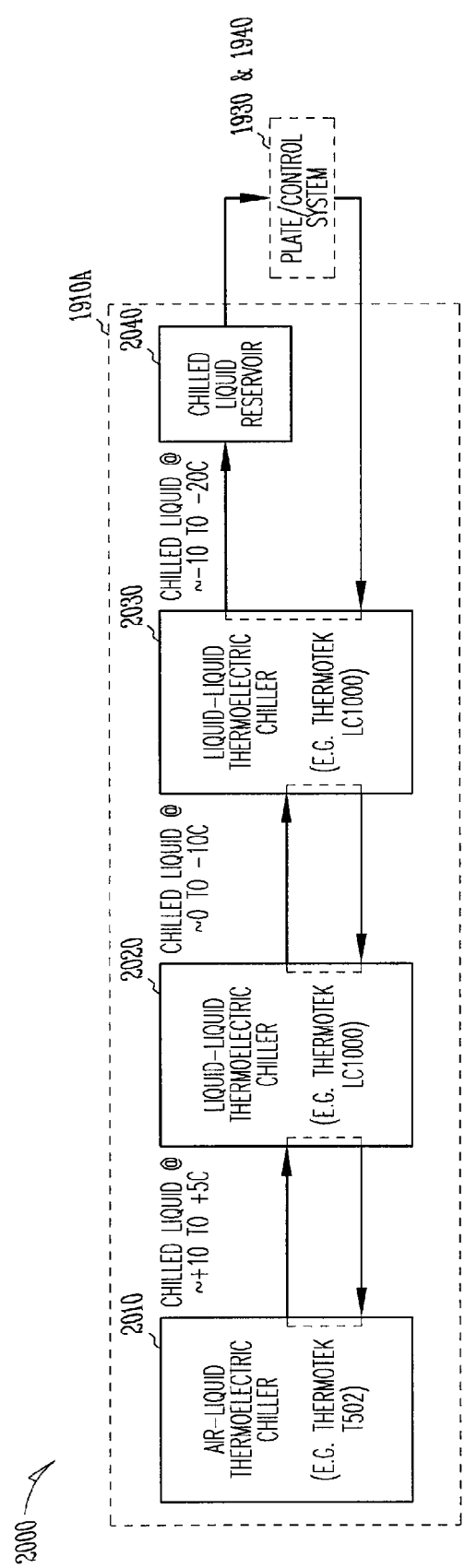
FIG. 20 is schematic a chilling system 2000 used in some embodiments.

FIG. 20 is schematic a chilling system 2000 used in some embodiments, wherein system 1910A is used for chilling system 1910 of FIG. 19. System 1910A includes a multistage series of thermoelectric chillers to successively lower the temperature of the circulating chilled liquids. In some embodiments, an air-liquid thermoelectric chiller 2010 provides chilled liquid at about +10 C to +5 C to the high side of liquid-liquid thermoelectric chiller 2020, which provides chilled liquid at about +0 C to −10 C to the high side of liquid-liquid thermoelectric chiller 2030, which provides chilled liquid at about −10 C to −20 C, which is then accumulated in chilled liquid reservoir 2040, and supplied as needed to plate 1930 as controlled by controller 1940 as described for FIG. 19 above.

Figure 21:
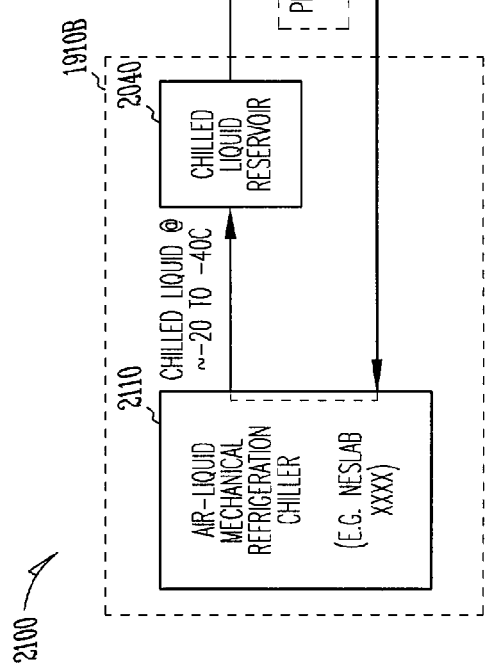
FIG. 21 is schematic a chilling system 2100 used in some embodiments.

FIG. 21 is schematic a chilling system 2100 used in some embodiments, wherein system 1910B is used for chilling system 1910 of FIG. 19. System 1910B includes a single stage mechanical chiller to lower the temperature of the circulating chilled liquid. In some embodiments, an air-liquid mechanical chiller 2110 provides chilled liquid at about −10 C to −20 C, which is then accumulated in chilled liquid reservoir 2040, and supplied as needed to plate 1930 as controlled by controller 1940 as described for FIG. 19 above.

In some embodiments, chip 90 and/or other components are self-heated by applying power and/or switching signals, in order to supplement or replace the devices and methods for providing heating as described above.

In some embodiments, a thermal mask (e.g., a thermally insulating pad having one or more holes for the component(s) to which heat and cold are to be applied) is provided to help achieve thermal isolation of some components on the primary (e.g., top) side of PCB 94.

In some embodiments, chip-scale packages (e.g., a BGA chip 90 mounted directly onto PCB 94 without an intervening FC substrate 92) are tested using the above methods and apparatus of the invention.

Note that other embodiments include pins on FC substrate 92 to connect to PCB 94, or to a socket (such as a zero-insertion-force (ZIF) socket) soldered to PCB 94. Still other embodiments include other connection means for connecting chip 90 to substrate 92, such as flying wire bonds. Thus, the TST described above is not limited to only chips with BGA solder balls and FC substrates with BGA solder balls, but is widely applicable to many situations where it may be desirable to perform a thermal stratification test and/or thermal cycling and functional testing.

One embodiment of the present invention includes an apparatus that includes a first heat-transfer device (e.g., thermal forcing unit 411 and chamber 421 of FIG. 4, and similar combinations in FIGS. 5, 6, 9, 10, 11, and 12) for changing a temperature of a first surface of an electronic device, a second heat-transfer device (e.g., thermal forcing unit 412 and chamber 422 of FIG. 4, and similar combinations in FIGS. 5, 6, 9, 10, 11, and 12) for changing a temperature of a second surface of the electronic device opposite the first surface, a controller (e.g., 410 of FIG. 4 or program 941 of FIG. 9) operatively coupled to the first heat-transfer device and to the second heat-transfer device and operable during a first period of time to cause the first heat-transfer device to raise the temperature of the first surface and the second heat-transfer device to lower the temperature of the second surface to a level below the temperature of the first surface, and operable during a second period of time to cause the first heat-transfer device to lower the temperature of the first surface and the second heat-transfer device to raise the temperature of the second surface to a level above the temperature of the first surface of the electronic device.

Some embodiments further include a system 900 that includes a probe head 920 that includes one or more of the configurations 400, 500, 600, 1000, 1100, 1200, 1300, 1400, 1700, 1800 described above, the system 900 further comprising one or more information-processing systems 940 that collect testing results from the electronic device after the second period of time, and based on the testing results, sort the electronic device as good or faulty. In other embodiments, functional testing is performed during testing of some or all of the following features: probe head, manual cable or card insertion, automated cable or card insertion, host PC assist, diagnostic SW, data collection systems, etc.

In some embodiments, the first heat-transfer device includes a chamber (e.g., 421, 521, 621, or 1121) that substantially surrounds the first surface of the electronic device and circulates a heated fluid against the first surface of the electronic device during the first period of time.

In some embodiments, the second heat-transfer device includes a chamber (e.g., 422 or 1122) that substantially surrounds the second surface of the electronic device and circulates a cooled fluid against the second surface of the electronic device during the first period of time.

In some embodiments, the first surface includes substantially all of one side of a printed circuit board, and the second surface includes substantially all of the opposite side of the printed circuit board.

In some embodiments, the first surface includes substantially all of one side of a printed circuit board, and the second surface includes a substantially smaller portion of the opposite side of the printed circuit board corresponding to a single integrated circuit package mounted on the electronic device.

In some embodiments, the second heat-transfer device includes a thermally conductive surface that is pressed against the second surface of the electronic device and is cooled during the first period of time.

In some embodiments, the first surface includes substantially all of one side of a printed circuit board, and the second surface includes substantially all of the opposite side of the printed circuit board. In some such embodiments, the first surface includes substantially all of one side of a printed circuit board, and the second surface includes a substantially smaller portion of the opposite side of the printed circuit board corresponding to a single integrated circuit package mounted on the electronic device.

In some embodiments, the first heat-transfer device includes a thermally conductive surface that is pressed against the first surface of the electronic device and is heated during the first period of time.

In some embodiments, the first heat-transfer device includes a Peltier device, and has a compliant material between the Peltier device and the first surface of the electronic device.

In some embodiments, the second heat-transfer device includes a thermally conductive surface that is pressed against the second surface of the electronic device and is cooled during the first period of time.

In some embodiments, the second heat-transfer device includes a Peltier device, and has a compliant material between the Peltier device and the second surface of the electronic device.

In some embodiments, the first heat-transfer device includes a chamber that substantially surrounds the first surface of the electronic device and circulates a heated fluid against the first surface of the electronic device during the first period of time, the second heat-transfer device includes a chamber that substantially surrounds the second surface of the electronic device and circulates a cooled fluid against the second surface of the electronic device during the first period of time, the first surface includes substantially only a portion of one side of a printed circuit board corresponding to a single integrated circuit package mounted on the electronic device, and the second surface includes substantially only a portion of the opposite side of the printed circuit board corresponding to the single integrated circuit package.

One embodiment of the present invention includes a method for performing thermal-stress testing. This method includes providing an electronic device, and during a first period of time, heating a first side of the electronic device and simultaneously cooling a second side of the device opposite the first surface to create a thermal stratification profile, and performing a functional electronic test of an integrated circuit on the electronic device. Some embodiments earlier include heating both sides to induce solder creep.

Some embodiments of the method further include, during a second period of time subsequent to the first period of time, cooling the first side of the electronic device and simultaneously heating the second side of the electronic device.

Some embodiments of the method further include, during a second period of time subsequent to the first period of time, cooling the first side of the electronic device and simultaneously heating the second side of the electronic device, during a third period of time subsequent to the second period of time, heating the first side of the electronic device and simultaneously cooling the second side of the electronic device opposite the first surface, and during a fourth period of time subsequent to the third period of time, cooling the first side of the electronic device and simultaneously heating the second side of the electronic device.

Some embodiments of the method further include, during a fifth period of time subsequent to the fourth period of time, causing the temperature of both the first side and the second side of the electronic device to be approximately 25 degrees Celsius, and performing a functional electronic test of an integrated circuit on the electronic device at this room temperature.

Some embodiments of the method further include, during sixth a period of time subsequent to the fourth period of time, causing the temperature of both the first side and the second side of the electronic device to be cooled substantially below 25 degrees Celsius, and performing a functional electronic test of the integrated circuit at this lowered temperature.

Some embodiments of the method further include, during seventh a period of time subsequent to the fourth period of time, causing the temperature of both the first side and the second side of the electronic device to be heated substantially above 25 degrees Celsius, and performing a functional electronic test of the integrated circuit at this elevated temperature.

Some embodiments of the method further include repeatedly cycling a polarity of a thermal stratification profile of an integrated circuit package on the electronic device between a first direction and an opposite second direction, during an eighth period of time subsequent to the cycling, causing both the first side and the second side of the electronic device to be at a room temperature of approximately 25 degrees Celsius, and performing a functional electronic test of an integrated circuit on the electronic device at this room temperature, during a ninth period of time subsequent to the cycling, causing of both the first side and the second side of the electronic device to be cooled to an lowered temperature substantially below 25 degrees Celsius, and performing a functional electronic test of the integrated circuit at this lowered temperature, and during a tenth period of time subsequent to the cycling, causing both the first side and the second side of the electronic device to be heated to an elevated temperature substantially above 25 degrees Celsius, and performing a functional electronic test of the integrated circuit at this elevated temperature.

In some embodiments of the method, a magnitude of temperature difference during the cycling is approximately the difference between the elevated temperature and the lowered temperature. In some embodiments of the method, a magnitude of temperature difference during the cycling is substantially larger than the difference between the elevated temperature and the lowered temperature.

Some embodiments of the method further include, during an eleventh period of time subsequent to the cycling, causing first side of the electronic device to be cooled to the lowered temperature substantially below 25 degrees Celsius causing the second side of the electronic device to be heated to the elevated temperature substantially above 25 degrees Celsius, and performing a functional electronic test of the integrated circuit at this first differential temperature, and during a twelfth period of time subsequent to the cycling, causing second side of the electronic device to be cooled to the lowered temperature substantially below 25 degrees Celsius causing the first side of the electronic device to be heated to the elevated temperature substantially above 25 degrees Celsius, and performing a functional electronic test of the integrated circuit at this second differential temperature.

Another aspect of some embodiments include an apparatus that includes a controller, temperature stratification means as described above, operatively coupled to the controller, for repeatedly cycling a temperature profile across an electronic device between two directions. In some embodiments, the temperature stratification means includes a fluid circulation chamber means for turbulently flowing a heat-exchange fluid in contact with an integrated circuit on the electronic device. In some embodiments, the temperature stratification means includes a heat-transfer surface means for contacting and conducting heat to an integrated circuit on the electronic device.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. A method comprising:
   during a first period of time, heating a first side of an electronic device and simultaneously cooling a second side of the electronic device opposite the first surface to create a thermal stratification profile; and
   performing a functional electronic test of an integrated circuit on the electronic device.

2. The method of claim 1, further comprising:
   during a second period of time subsequent to the first period of time, cooling the first side of the electronic device and simultaneously heating the second side of the electronic device.

3. A computer-readable medium having instructions stored thereon for causing a suitably programmed information-processing system to perform the method of claim 2.

4. The method of claim 1, further comprising:
   during a second period of time subsequent to the first period of time, cooling the first side of the electronic device and simultaneously heating the second side of the electronic device;
   during a third period of time subsequent to the second period of time, heating the first side of the electronic device and simultaneously cooling the second side of the electronic device; and
   during a fourth period of time subsequent to the third period of time, cooling the first side of the electronic device and simultaneously heating the second side of the electronic device.

5. The method of claim 4, further comprising:
   during a fifth period of time subsequent to the fourth period of time, causing the temperature of both the first side and the second side of the electronic device to be approximately 25 degrees Celsius, and performing a functional electronic test of an integrated circuit on the electronic device.

6. The method of claim 5, further comprising:
   during a sixth period of time subsequent to the fourth period of time, cooling both the first side and the second side of the electronic device to a temperature substantially below 25 degrees Celsius, and performing a functional electronic test of the integrated circuit.

7. The method of claim 6, further comprising:
   during a seventh period of time subsequent to the fourth period of time, heating both the first side and the second side of the electronic device to a temperature substantially above 25 degrees Celsius, and performing a functional electronic test of the integrated circuit.

8. The method of claim 1, further comprising:
   repeatedly cycling a polarity of a thermal stratification profile of an integrated circuit package on the electronic device between a first direction and an opposite second direction;
   during an eighth period of time subsequent to the cycling, causing both the first side and the second side of the electronic device to be at a temperature of approximately 25 degrees Celsius, and performing a functional electronic test of an integrated circuit on the electronic device;
   during a ninth period of time subsequent to the cycling, cooling both the first side and the second side of the electronic device to a lowered temperature substantially below 25 degrees Celsius, and performing a functional electronic test of the integrated circuit; and
   during a tenth period of time subsequent to the cycling, heating both the first side and the second side of the electronic device to an elevated temperature substantially above 25 degrees Celsius, and performing a functional electronic test of the integrated circuit.

9. The method of claim 8, wherein a magnitude of temperature difference during the cycling is approximately the difference between the elevated temperature and the lowered temperature.

10. The method of claim 8, wherein a magnitude of temperature difference during the cycling is substantially larger than the difference between the elevated temperature and the lowered temperature.

11. The method of claim 10, further comprising:
    during an eleventh period of time subsequent to the cycling, cooling the first side of the electronic device to the lowered temperature substantially below 25 degrees Celsius and heating the second side of the electronic device to the elevated temperature substantially above 25 degrees Celsius, and performing a functional electronic test of the integrated circuit; and
    during a twelfth period of time subsequent to the cycling, cooling second side of the electronic device to the lowered temperature substantially below 25 degrees Celsius and heating the first side of the electronic device to the elevated temperature substantially above 25 degrees Celsius, and performing a functional electronic test of the integrated circuit.

12. The method of claim 2, further comprising conveying the electronic device through a plurality of cells to achieve the heating and cooling.

13. The method of claim 2, further comprising:
during a period of time immediately prior to the first period of time, heating both the first side and the second side of the electronic device in order to induce solder creep.

14. A computer-readable medium having instructions stored thereon for causing a suitably programmed information-processing system to perform the method of claim 13.

* * * * *